US012063785B2

(12) United States Patent
Chang et al.

(10) Patent No.: US 12,063,785 B2
(45) Date of Patent: Aug. 13, 2024

(54) INTEGRATED CIRCUIT, MEMORY DEVICE AND METHOD OF MANUFACTURING THE SAME

(71) Applicant: TAIWAN SEMICONDUCTOR MANUFACTURING COMPANY LTD., Hsinchu (TW)

(72) Inventors: Kuo-Pin Chang, Hsinchu County (TW); Chien Hung Liu, Hsinchu County (TW); Chih-Wei Hung, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 298 days.

(21) Appl. No.: 17/462,663

(22) Filed: Aug. 31, 2021

(65) Prior Publication Data

US 2023/0071284 A1 Mar. 9, 2023

(51) Int. Cl.
*H10B 51/20* (2023.01)
*H10B 51/30* (2023.01)

(52) U.S. Cl.
CPC ............ *H10B 51/20* (2023.02); *H10B 51/30* (2023.02)

(58) Field of Classification Search
CPC ........ H10B 51/10; H10B 51/20; H10B 51/30; H10B 53/10; H10B 53/20; H10B 53/30
See application file for complete search history.

(56) References Cited

U.S. PATENT DOCUMENTS

| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2021/0375932 | A1* | 12/2021 | Wang ..................... H10B 51/10 |
| 2022/0399400 | A1* | 12/2022 | Takashima ............. H10B 63/34 |

* cited by examiner

*Primary Examiner* — Matthew E Warren
(74) *Attorney, Agent, or Firm* — WPAT LAW; Anthony King

(57) ABSTRACT

A memory cell, an integrated circuit and method of manufacturing the same are provided. The memory device includes a substrate, gate layers and insulating layers, an isolation column, a channel layer, a first conductive feature, a second conductive feature, a storage layer and a pair of isolation structures. The isolation column extends through the gate layers and the insulating layers along a first direction. The channel layer laterally covers the isolation column. The first conductive feature and second conductive feature extend along the first direction and adjacent to the isolation column. The storage layer is disposed between the gate layers and the channel layer. The pair of isolation structures extends along the first direction. The pair of isolation structures includes a first isolation structure disposed between the first conductive feature and the gate layers, and a second isolation structure disposed between the second conductive feature and the gate layers.

20 Claims, 27 Drawing Sheets

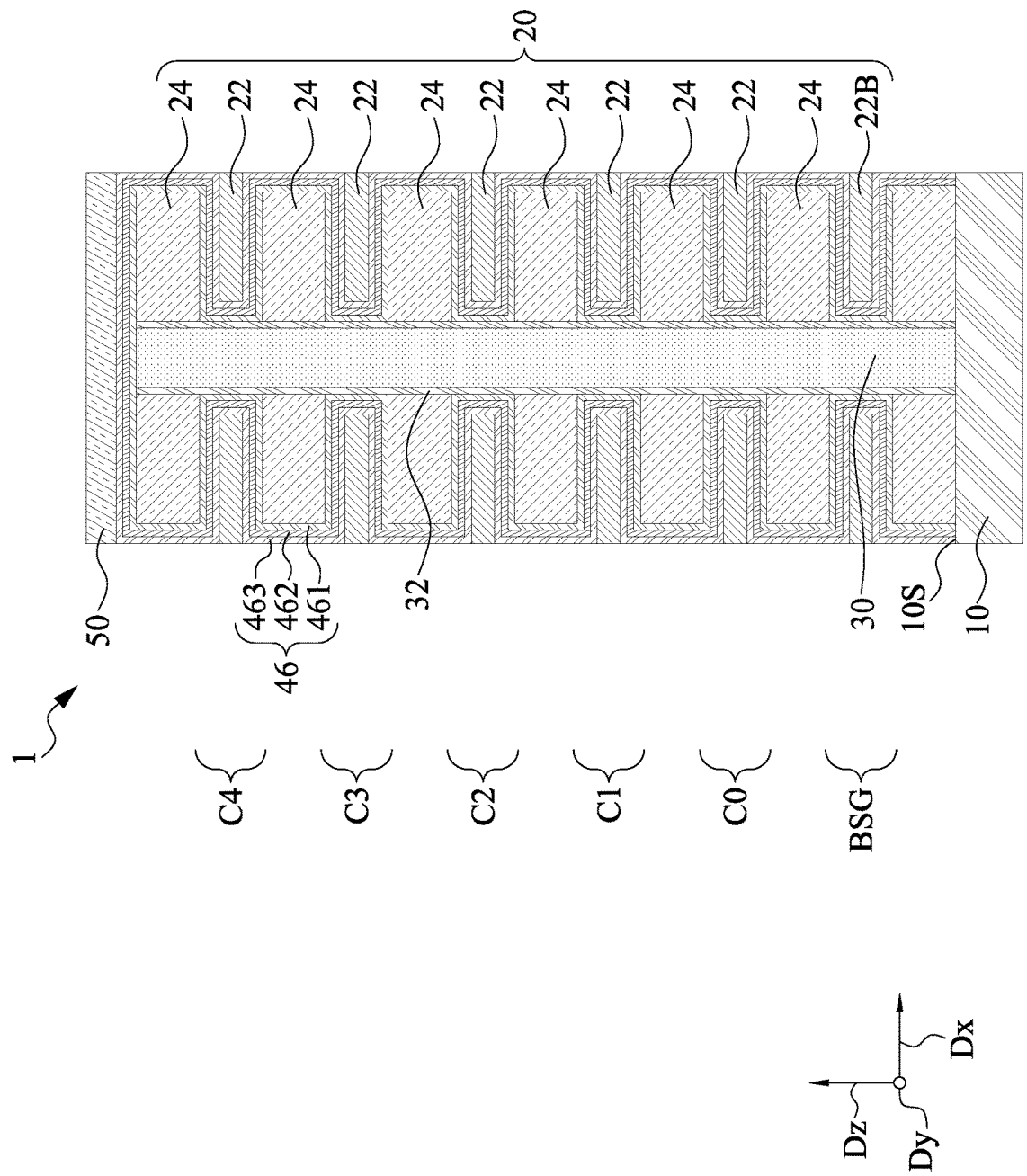

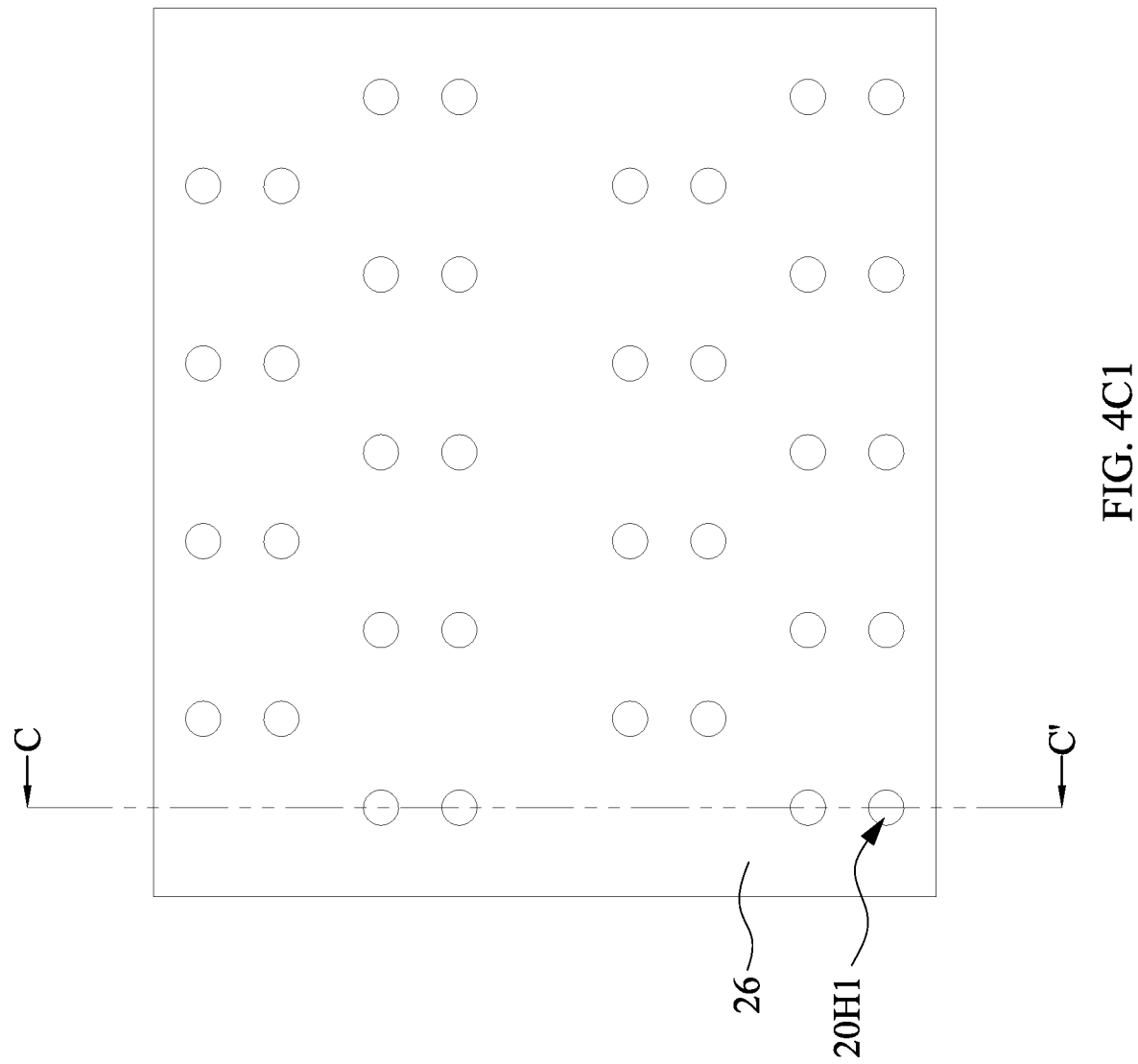
FIG. 4C1

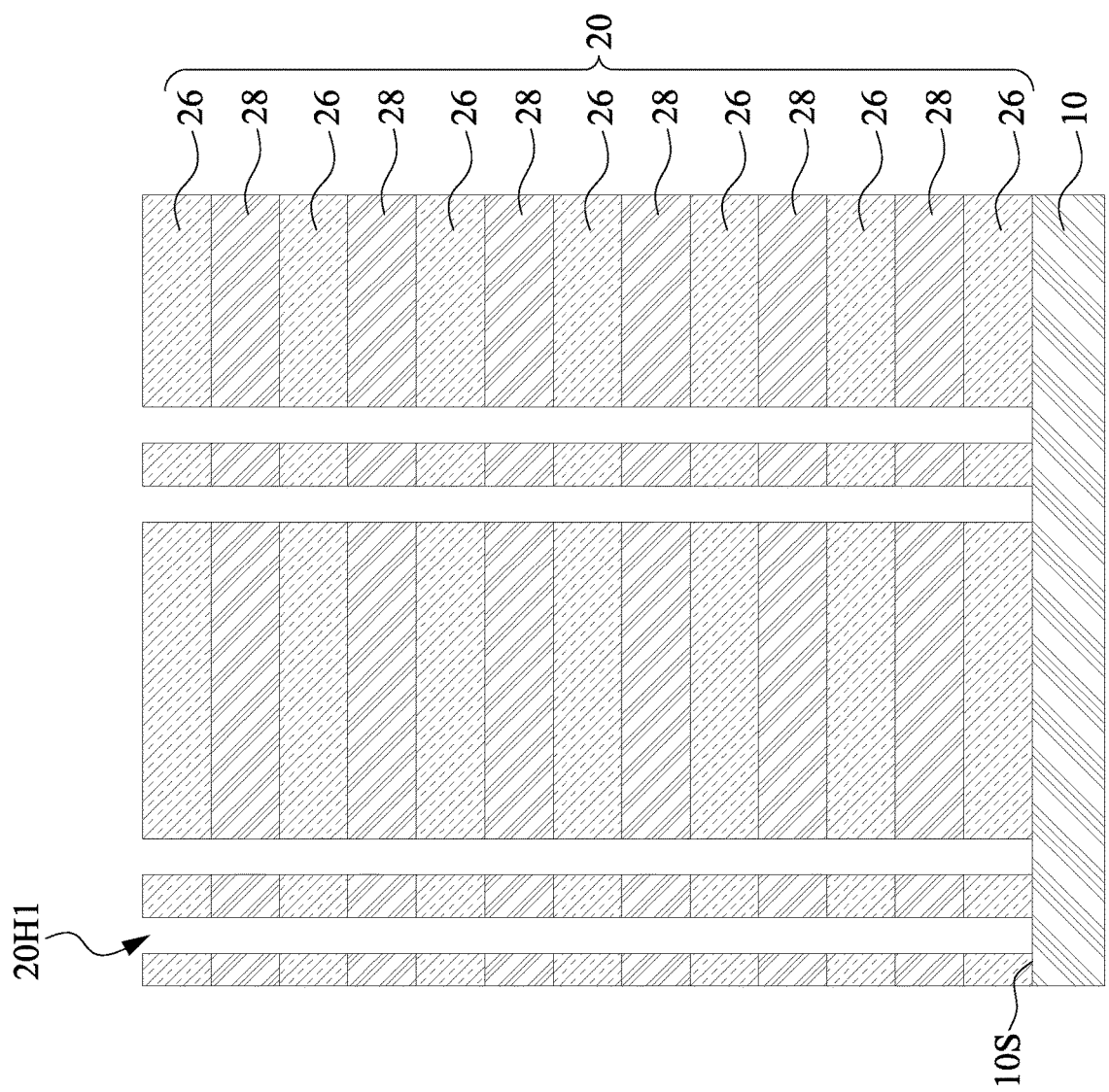

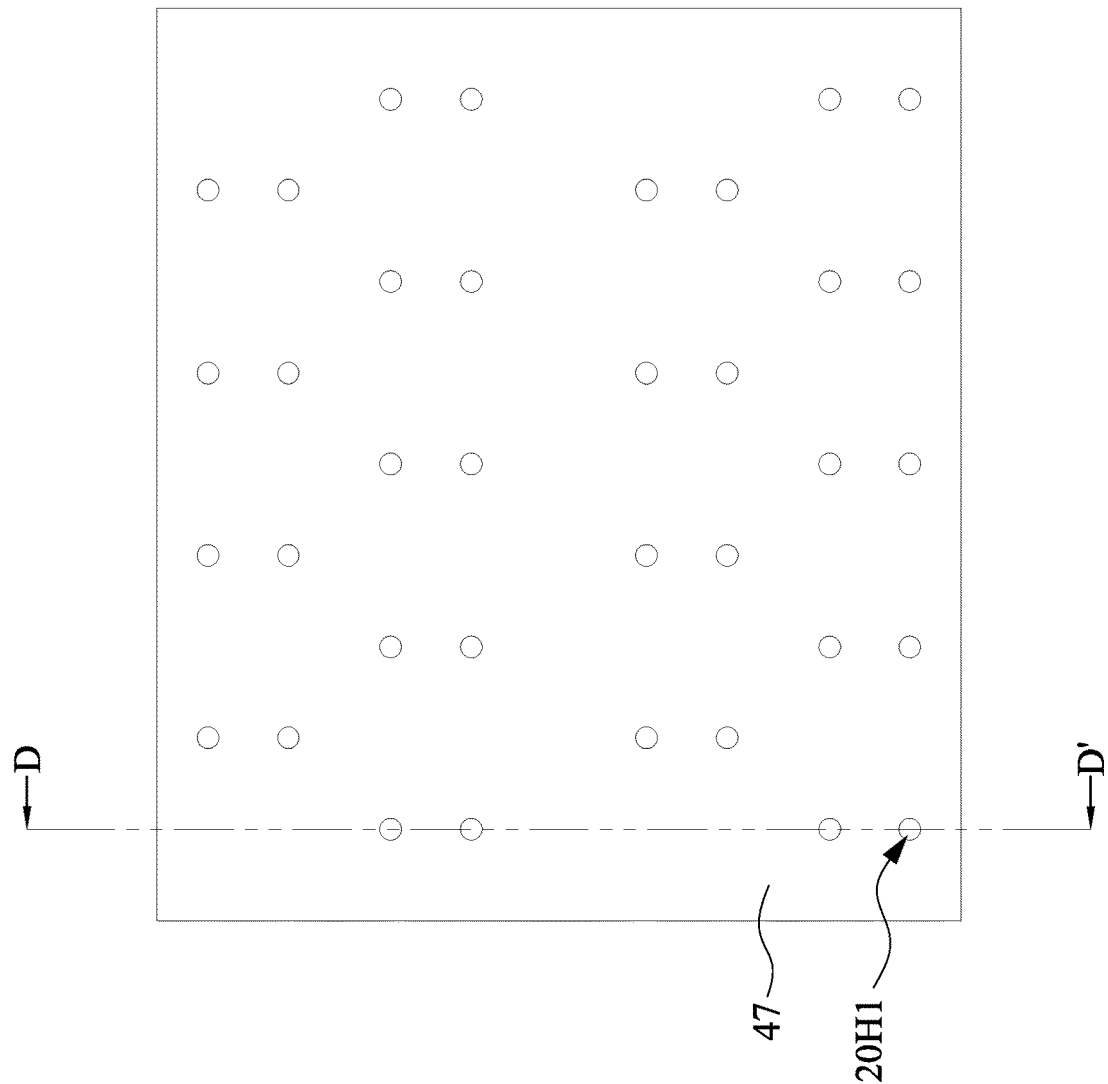

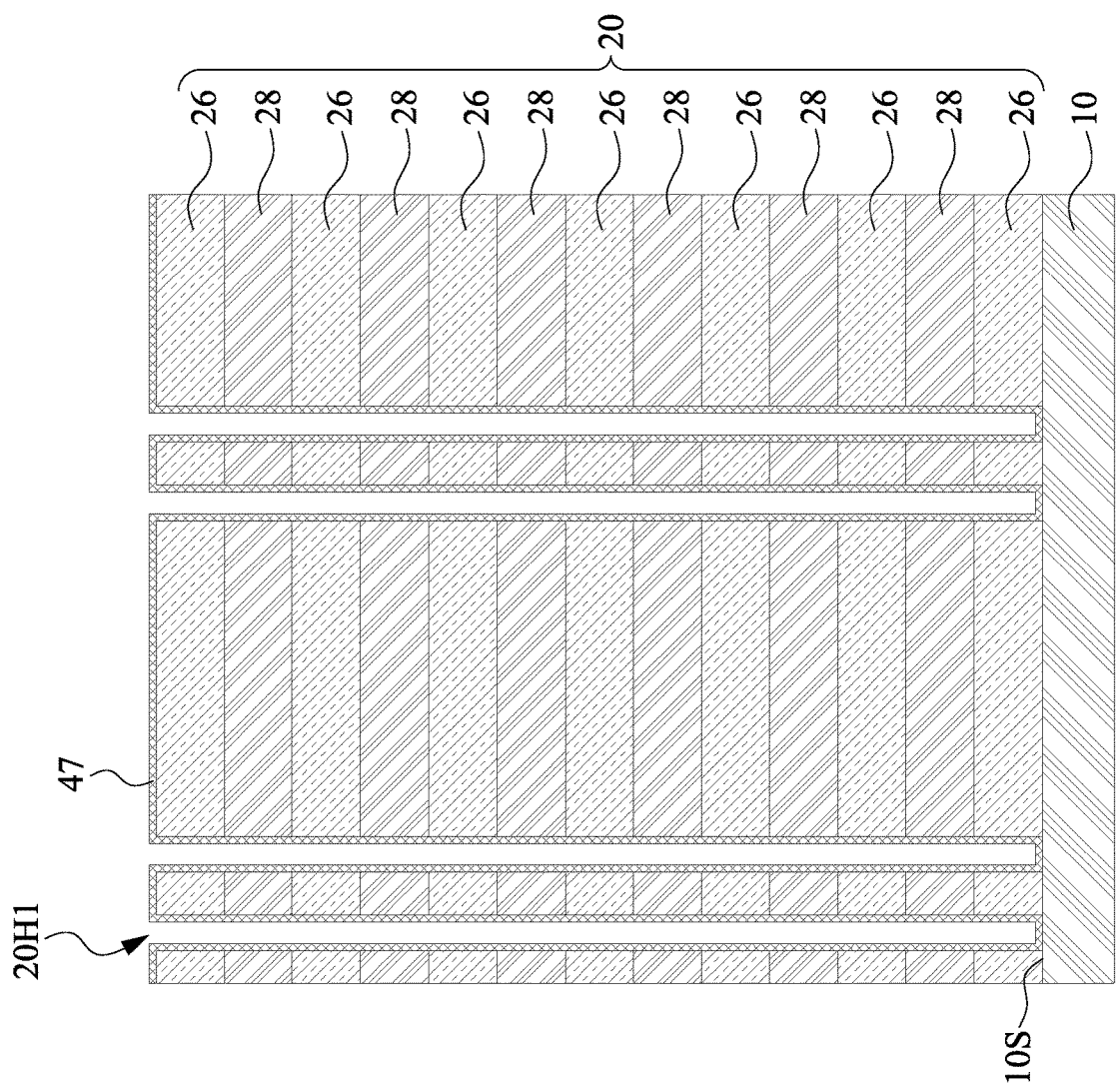
FIG. 4D2

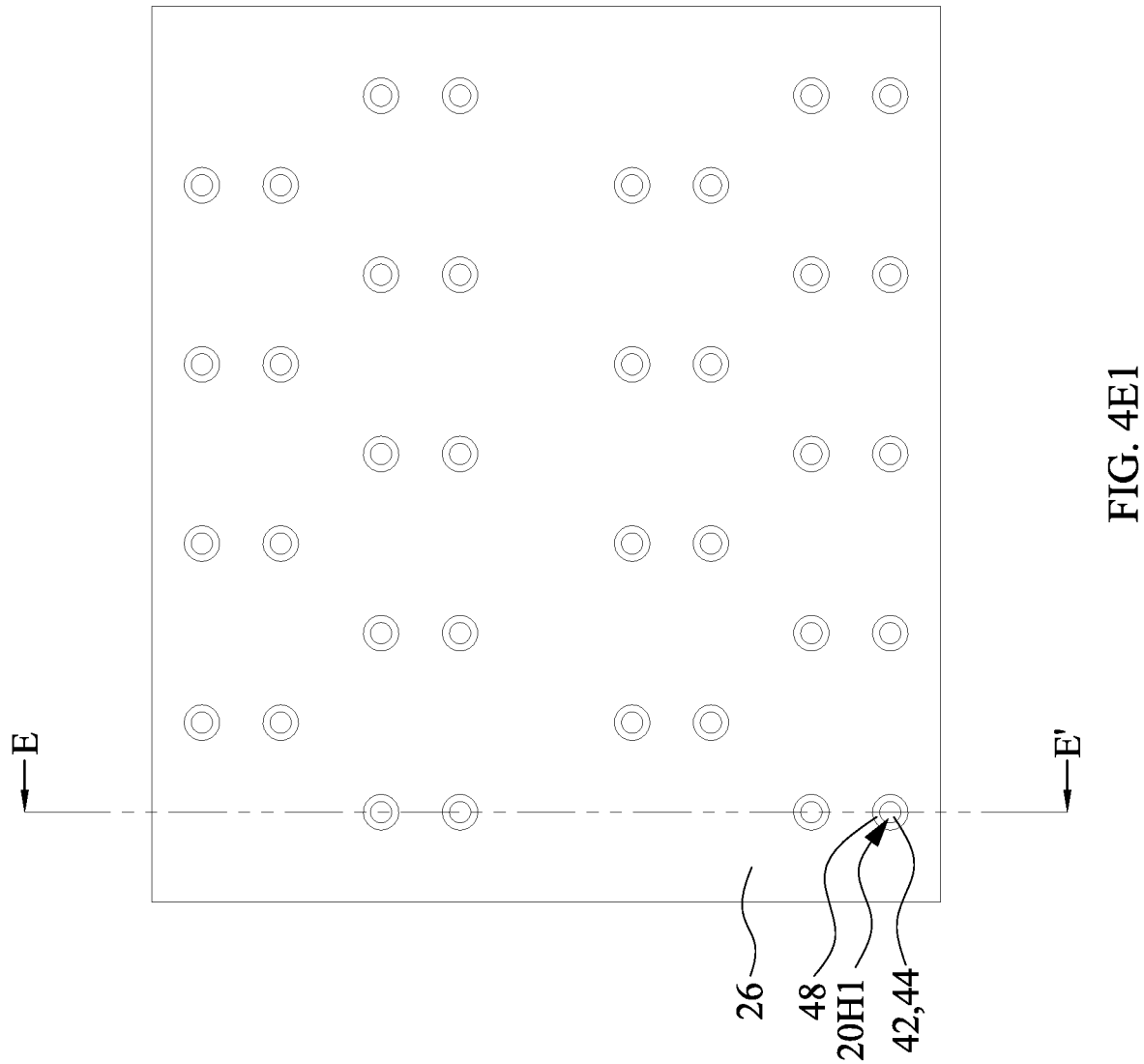
FIG. 4E1

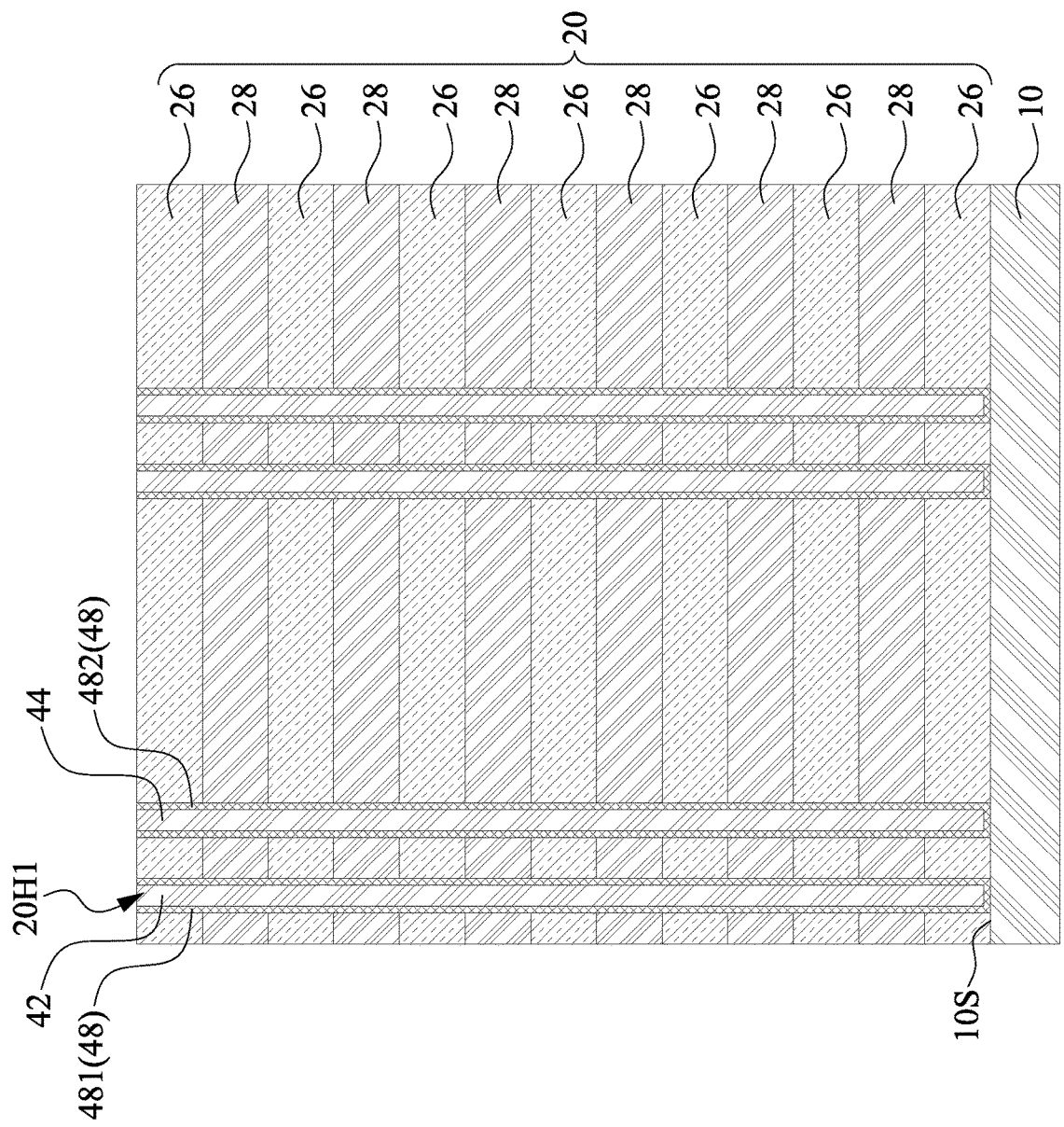
FIG. 4E2

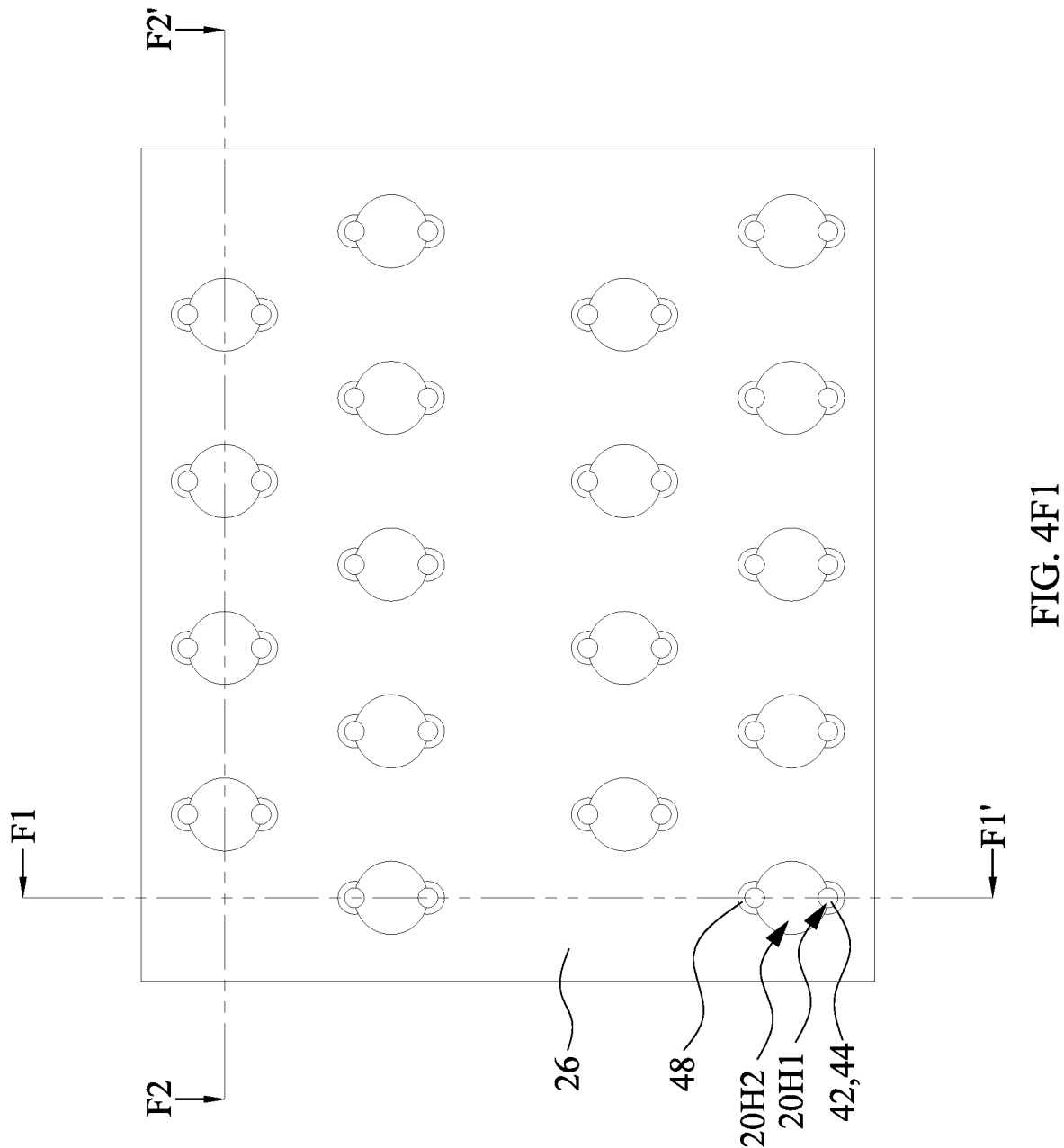
FIG. 4F1

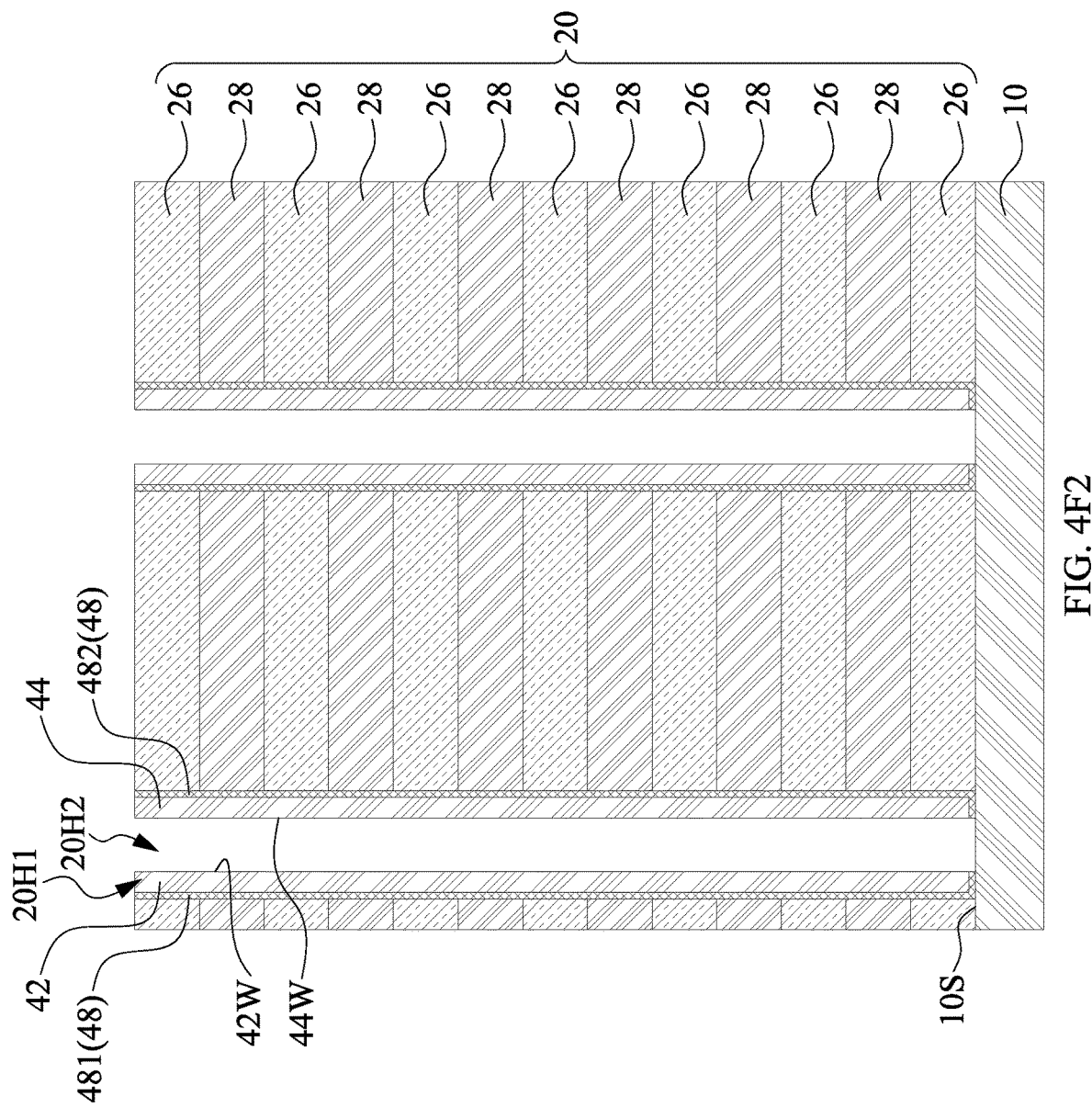
FIG. 4F2

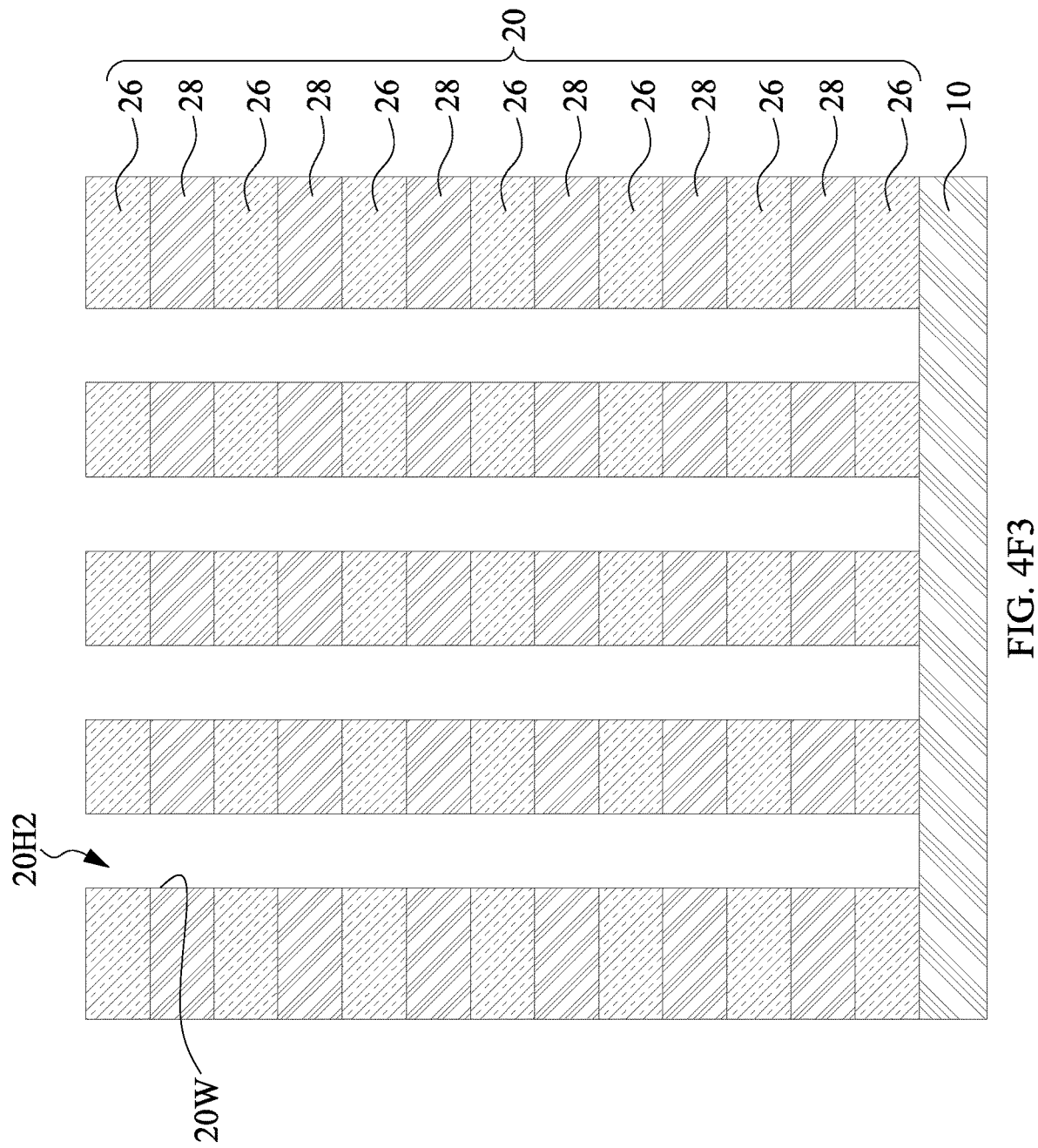
FIG. 4F3

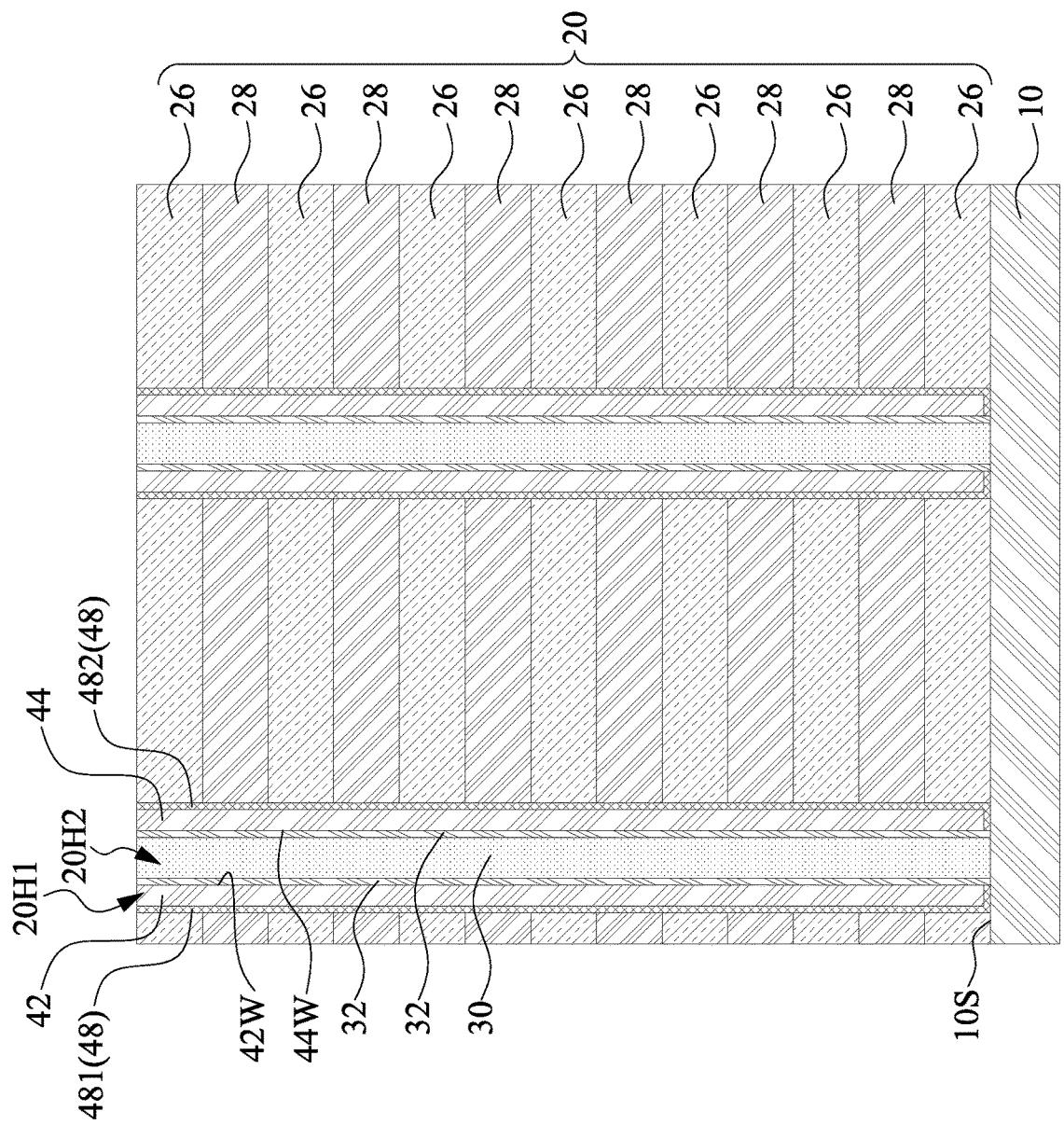
FIG. 4G1

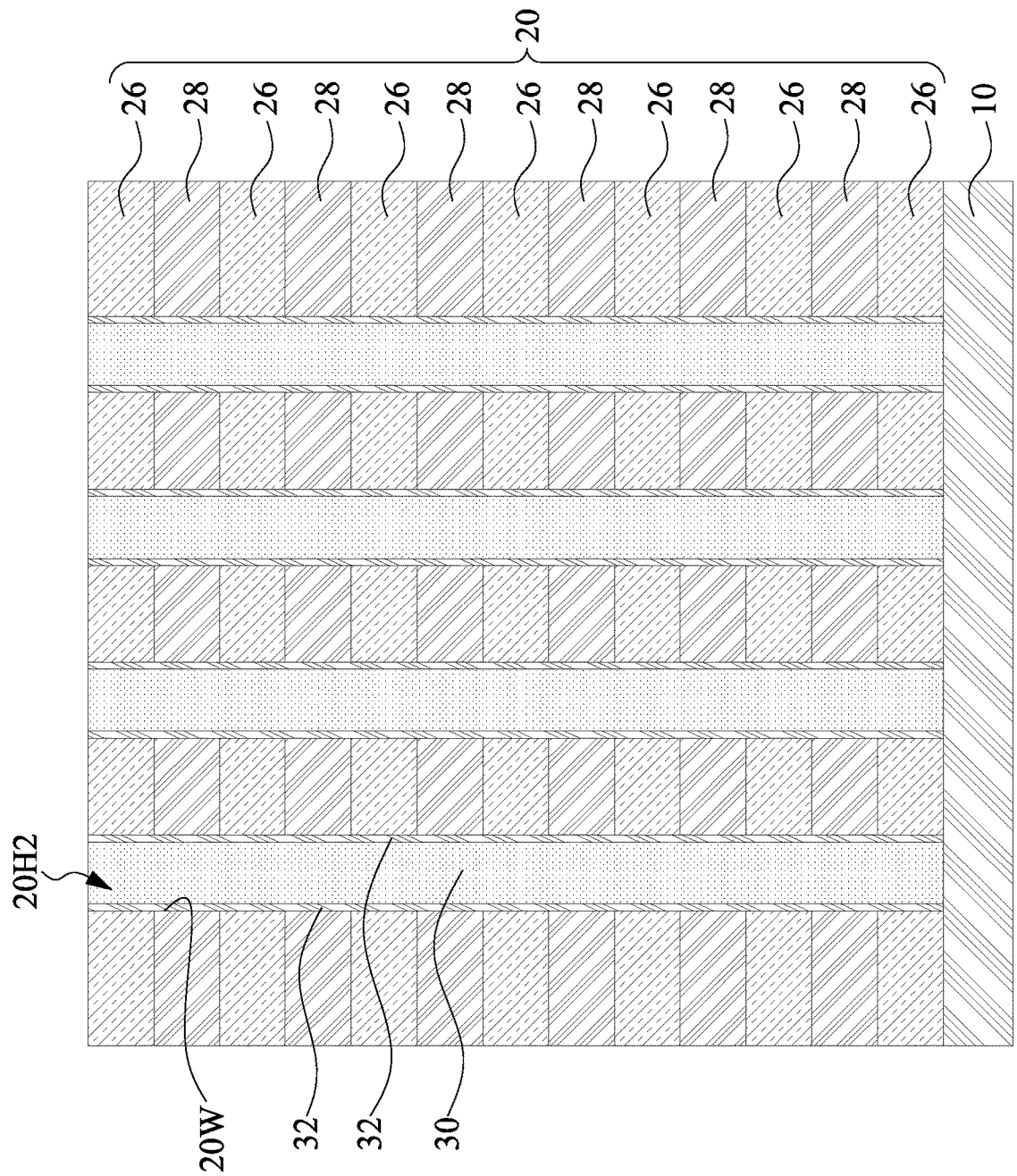
FIG. 4G2

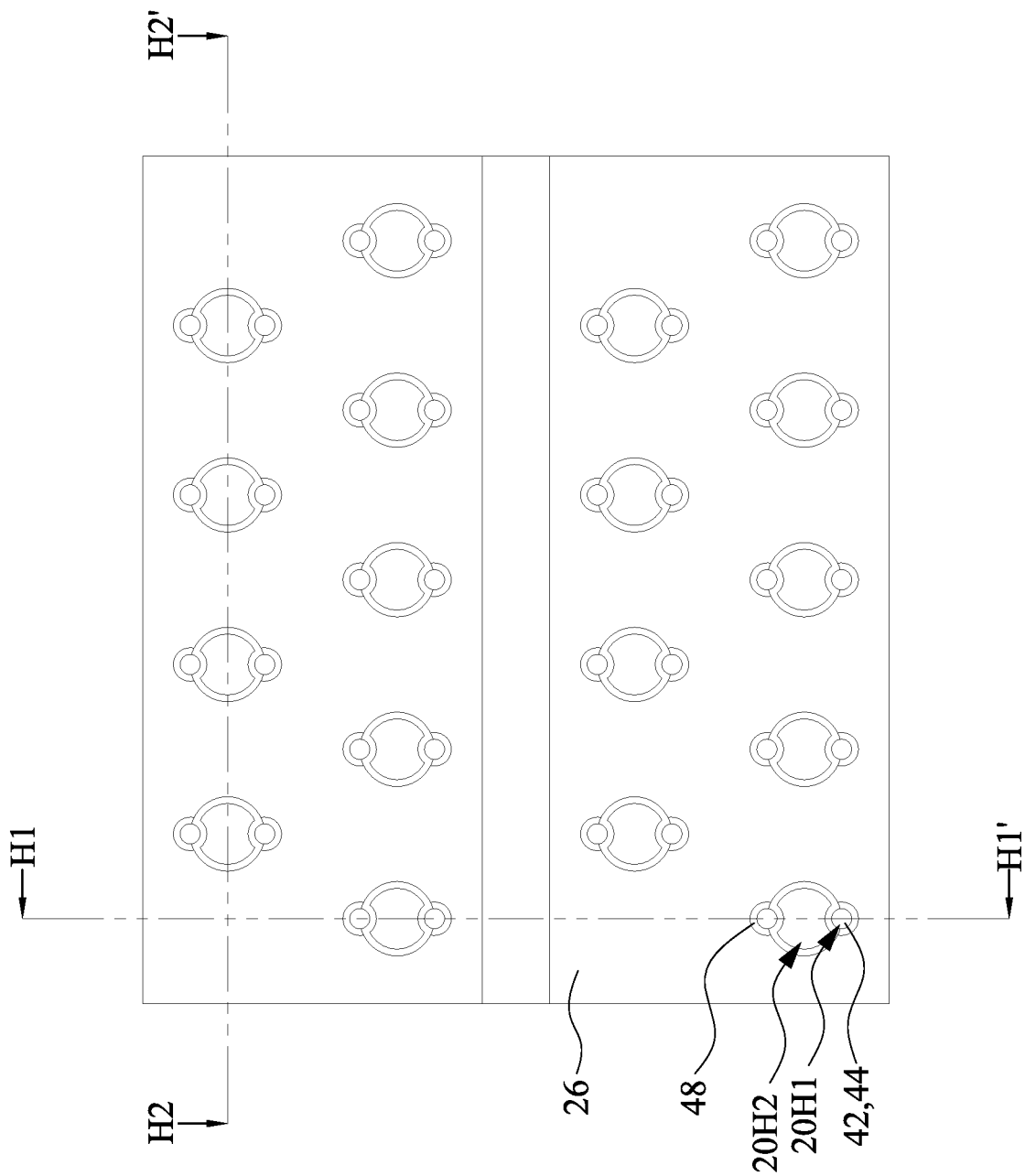

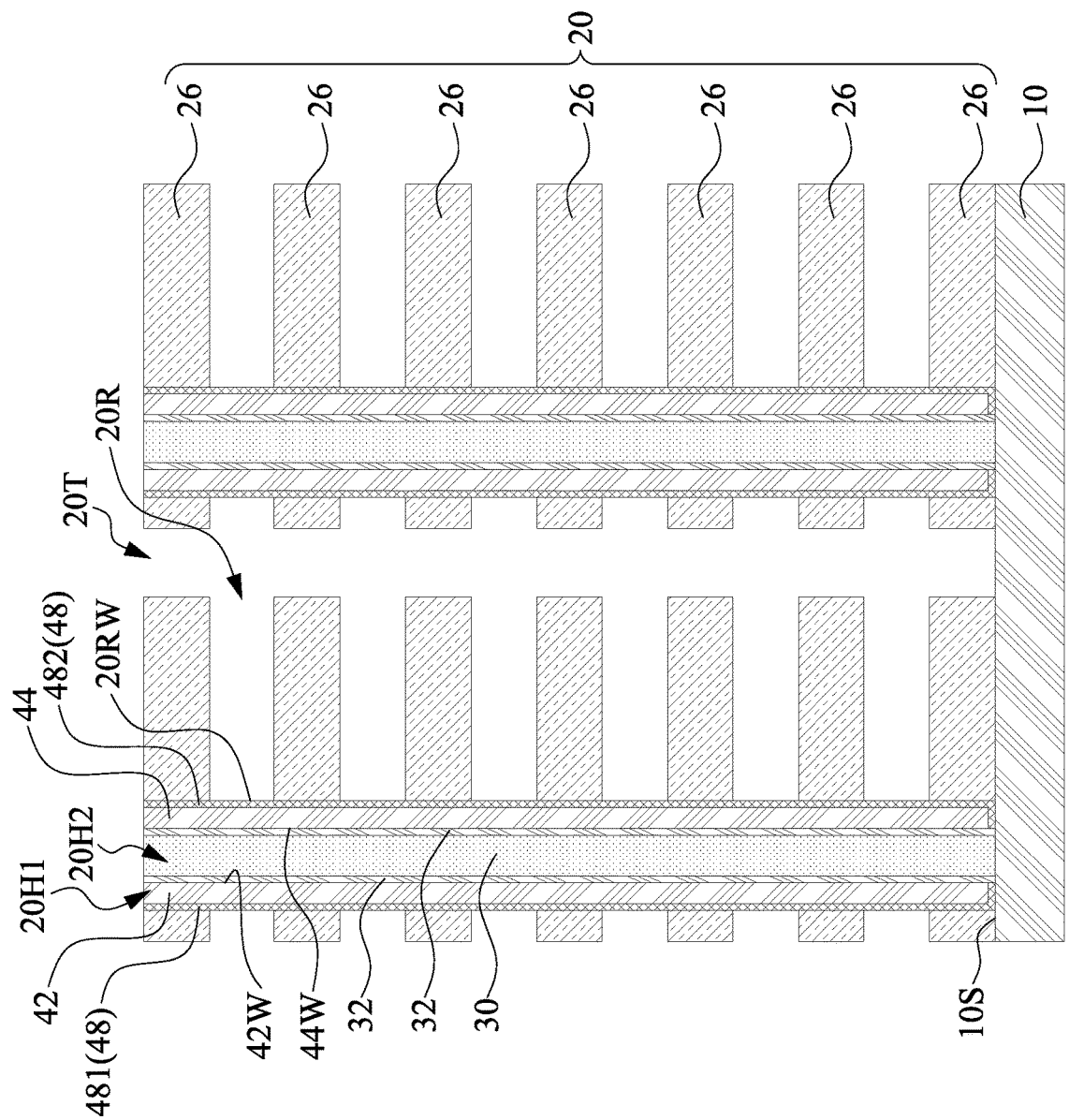
FIG. 4H2

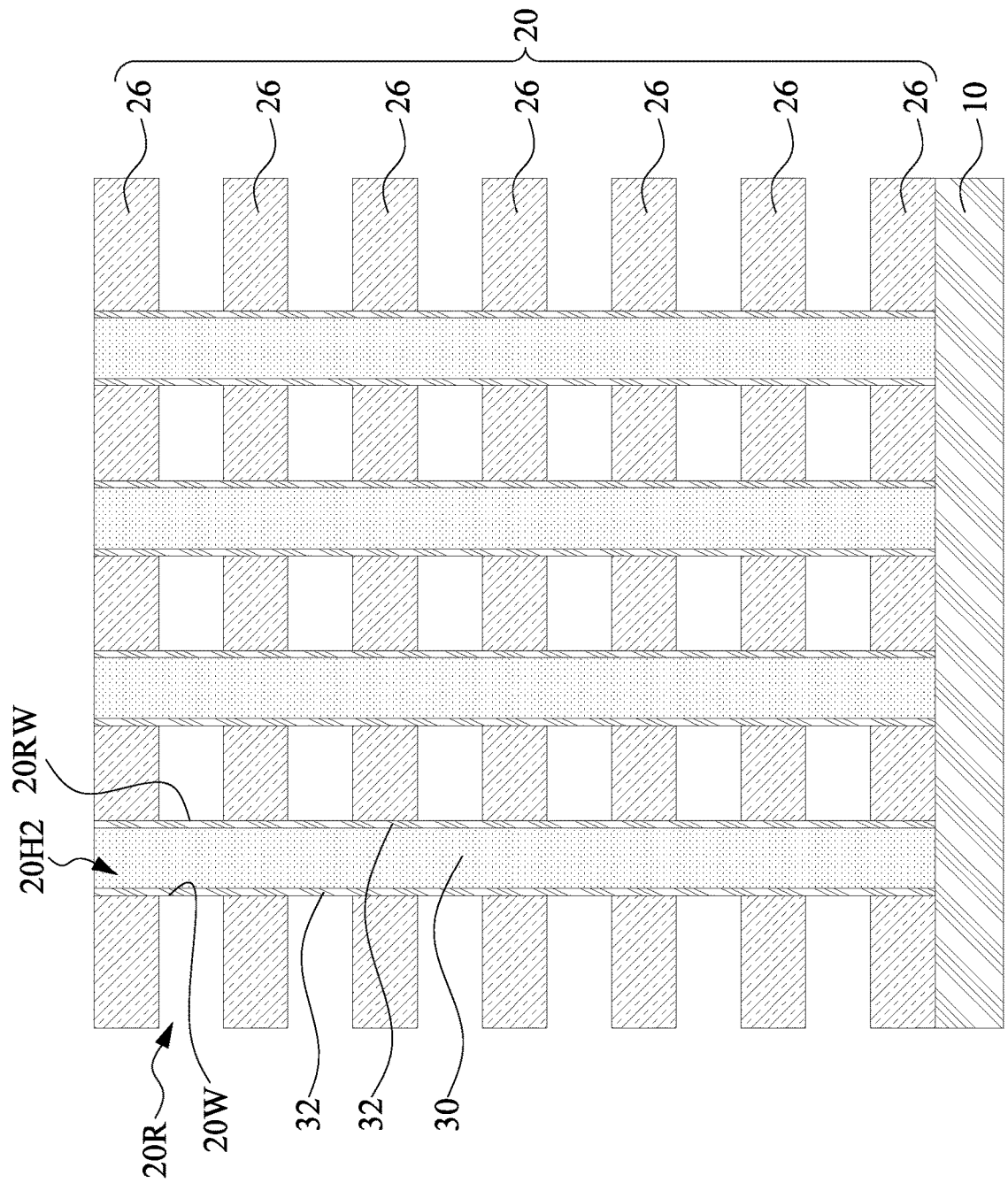
FIG. 4H3

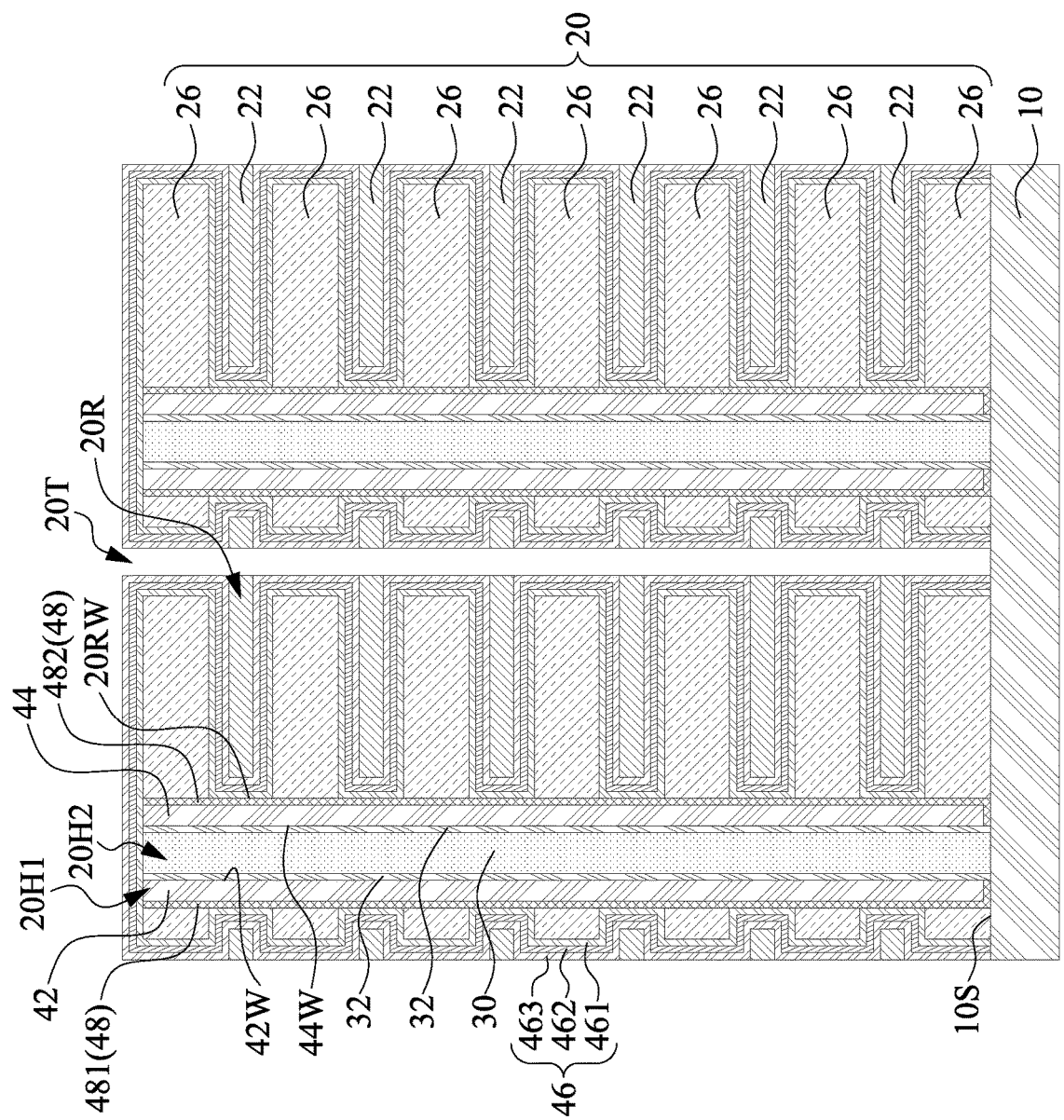
FIG. 4I1

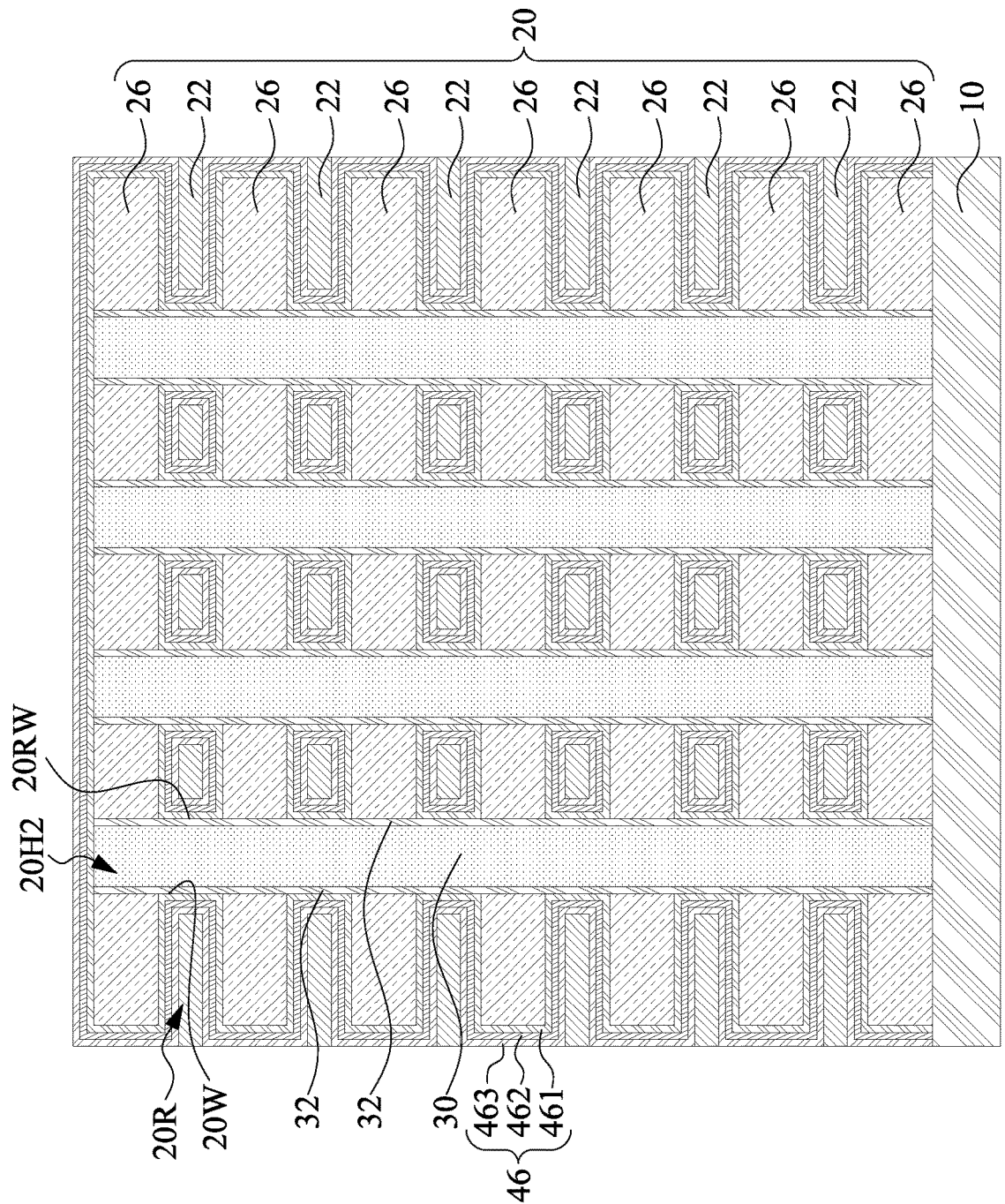
FIG. 4I2

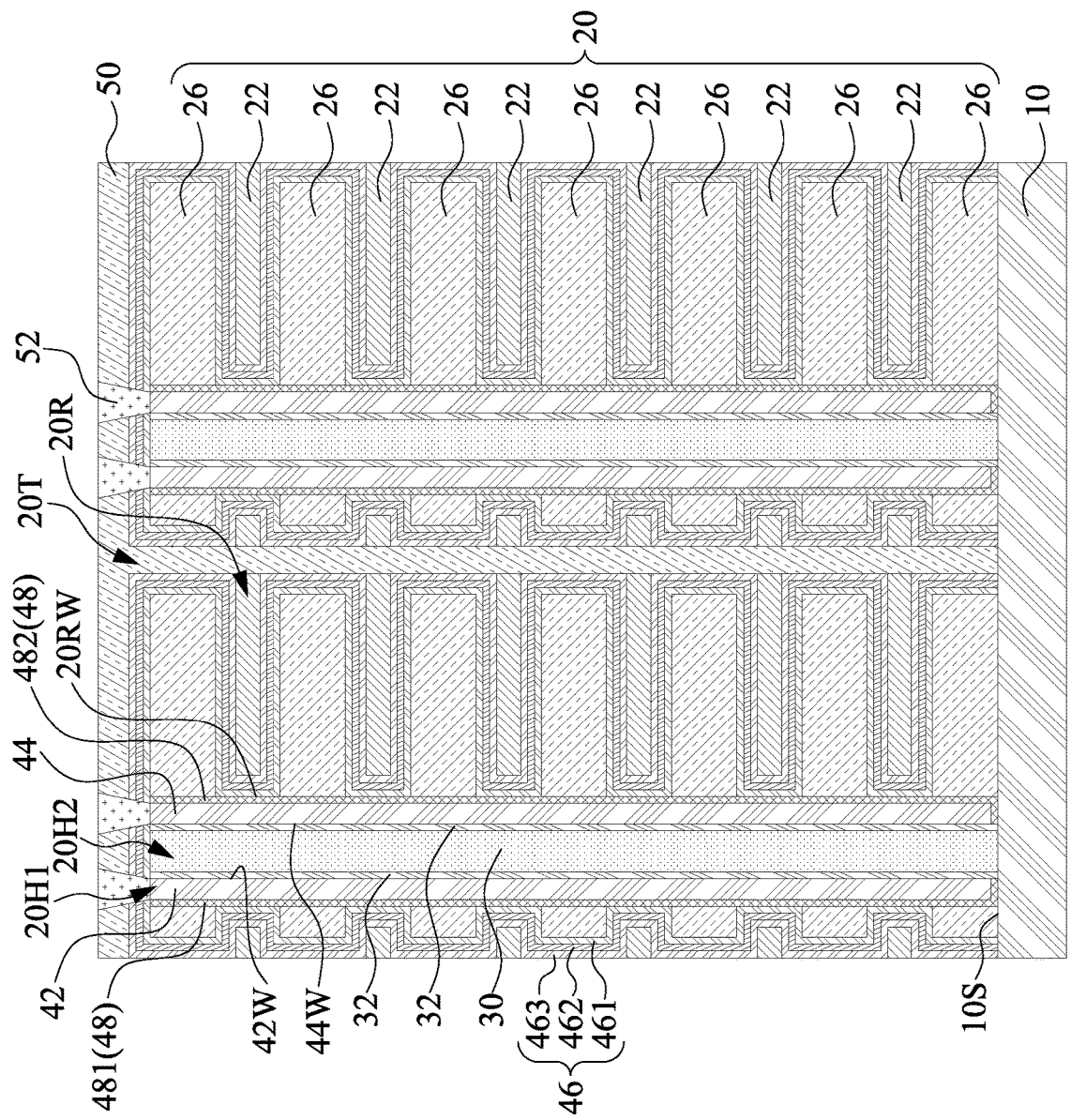
FIG. 4J1

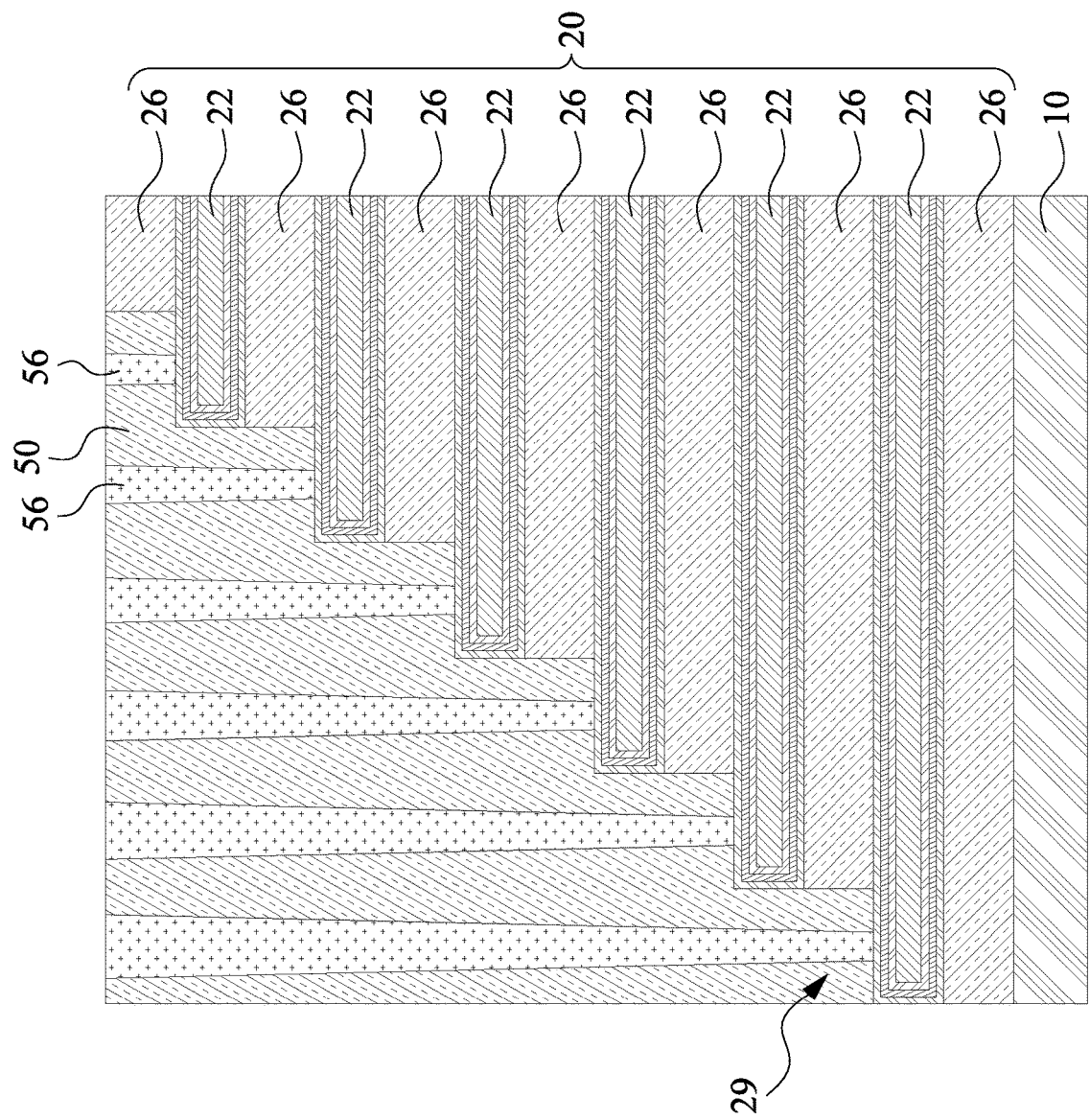
FIG. 4J2

INTEGRATED CIRCUIT, MEMORY DEVICE AND METHOD OF MANUFACTURING THE SAME

BACKGROUND

Nonvolatile memory is a memory that has the capability to hold saved data even if the power is turned off well known in the art. Among various types of nonvolatile memories, flash memory has become one of the more popular types of nonvolatile memory due to its high performance in speed and random access read. The density of flash memory, however, can be further increased to meet the requirement for some application such as supply chain management and AI applications, for instance.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 2A, FIG. 2B, FIG. 2C and FIG. 2D are schematic diagrams illustrating an integrated circuit in accordance with some embodiments of the present disclosure.

FIG. 4A, FIG. 4B, FIG. 4C1, FIG. 4C2, FIG. 4D1, FIG. 4D2, FIG. 4E1, FIG. 4E2, FIG. 4F1, FIG. 4F2, FIG. 4F3, FIG. 4G1, FIG. 4G2, FIG. 4H1, FIG. 4H2, FIG. 4H3, FIG. 4I1, FIG. 4I2, FIG. 4J1 and FIG. 4J2 are schematic views at one of various operations of manufacturing an integrated circuit according to one or more embodiments of the present disclosure.

DETAILED DESCRIPTION

Figure 1:
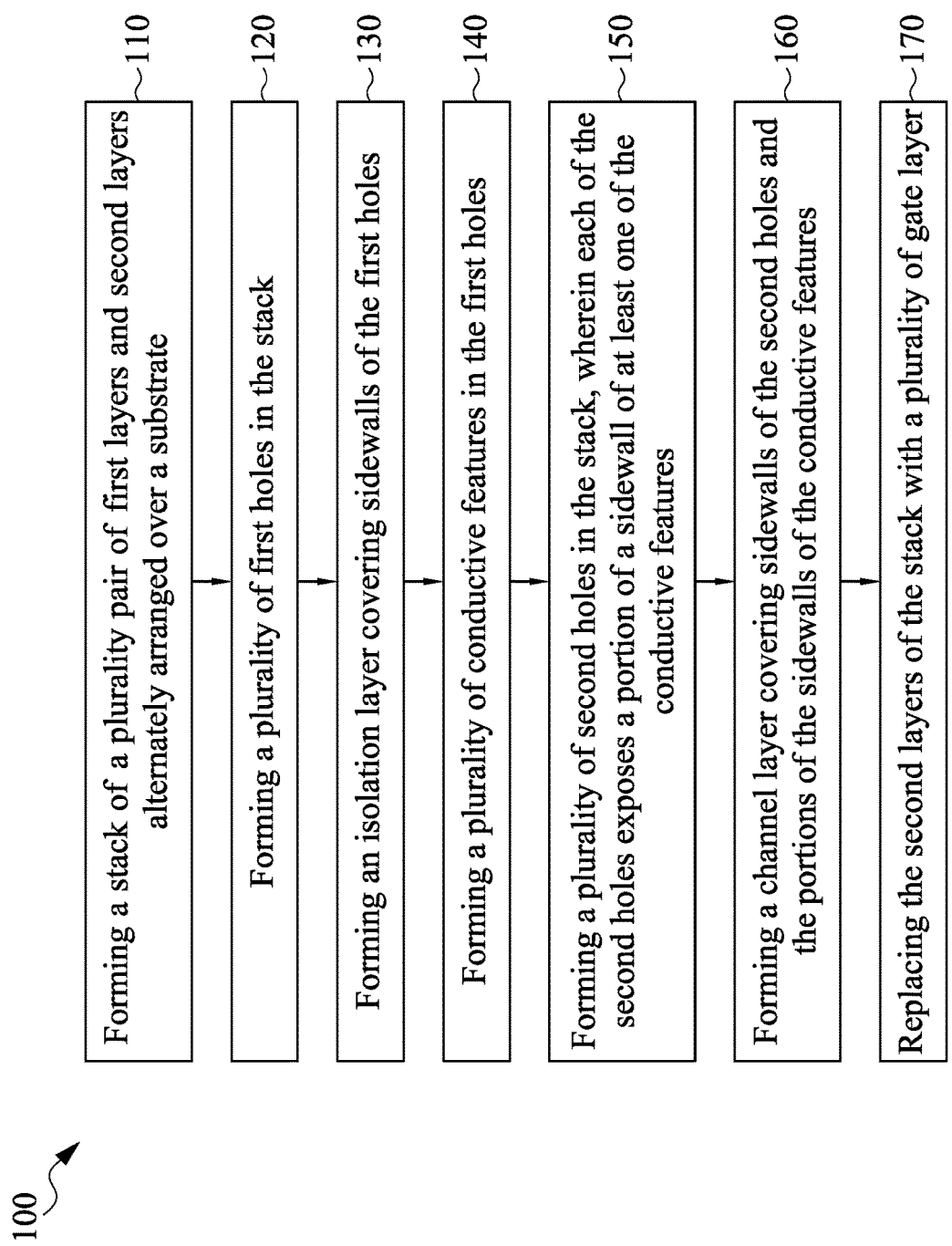
FIG. 1 is a flow chart illustrating a method for manufacturing an integrated circuit according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In one or more embodiments of the present disclosure, a high density memory cell is provided. The memory device has vertical stacking storage layers, which can increase memory density. The memory device has gate all around (GAA) design, which can provide excellent and stable gate control and tight distribution. The channel layer is a ring shaped channel layer in a horizontal plane with a large channel width, which results in a high read current for the memory device. The bit lines and source lines are dedicated to control respective source electrodes and drain electrodes of the memory cells, and thus interference between adjacent memory cells can be alleviated. The memory device has small erase unit, and thus is good for system application such as wear leveling or garbage collection.

FIG. 1 is a flow chart illustrating a method for manufacturing an integrated circuit according to various aspects of one or more embodiments of the present disclosure. The method 100 begins with operation 110 in which a stack of a plurality pair of first layers and second layers alternately arranged is formed over a substrate. The method 100 proceeds with operation 120 in which a plurality of first holes is formed in the stack. The method 100 continues with operation 130 in which an isolation layer covering sidewalls of the first holes is formed. The method 100 proceeds with operation 140 in which a plurality of conductive features are formed in the first holes. The method continues with operation 150 in which a plurality of second holes are formed in the stack. Each of the second holes exposes a portion of a sidewall of at least one of the conductive features. The method 100 proceeds with operation 160 in which a channel layer covering sidewalls of the second holes and the portions of the sidewalls of the conductive features is formed. The method 100 proceeds with operation 170 the second layers of the stack are replaced with a plurality of gate layers.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
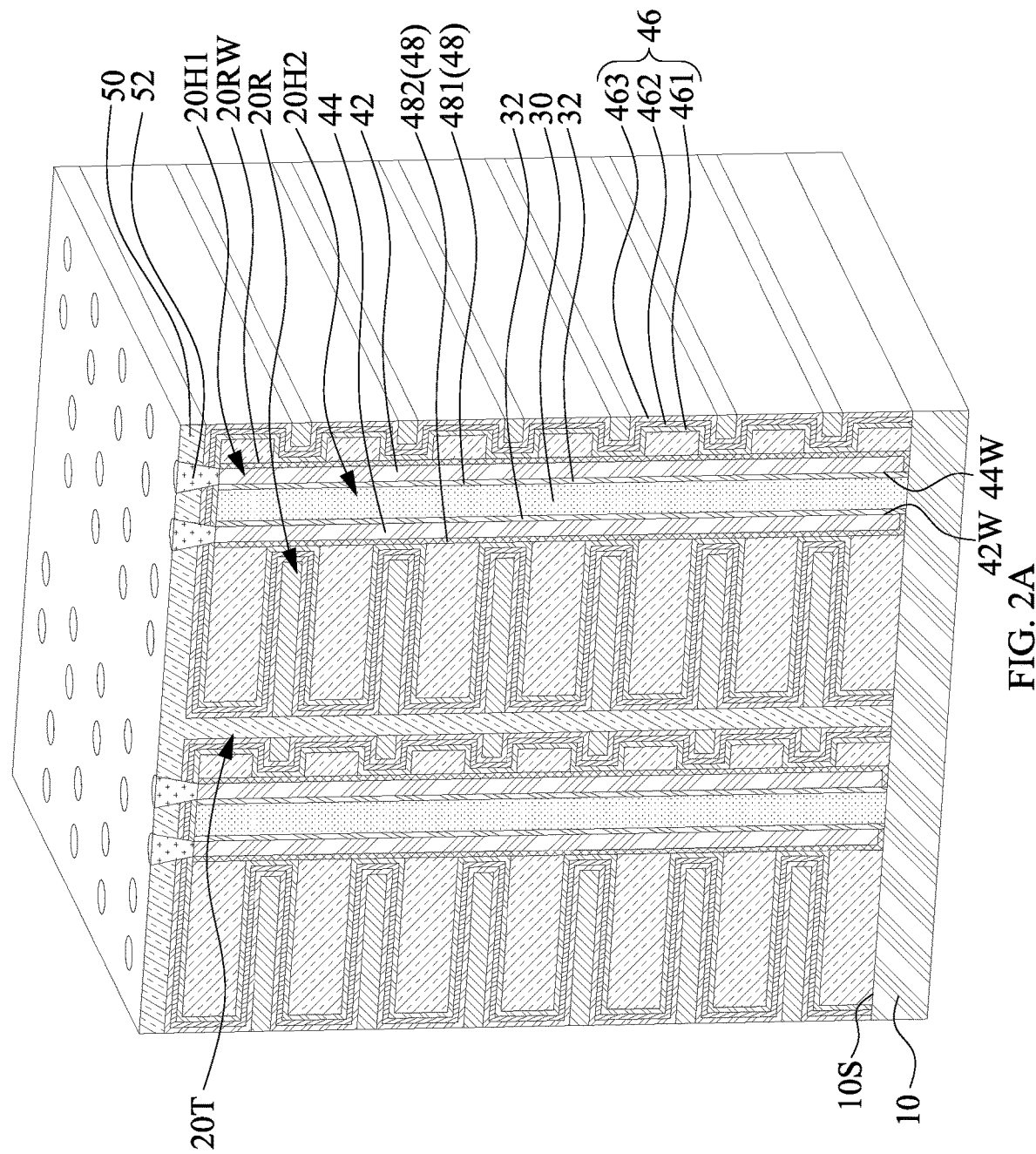
Figure 2B:
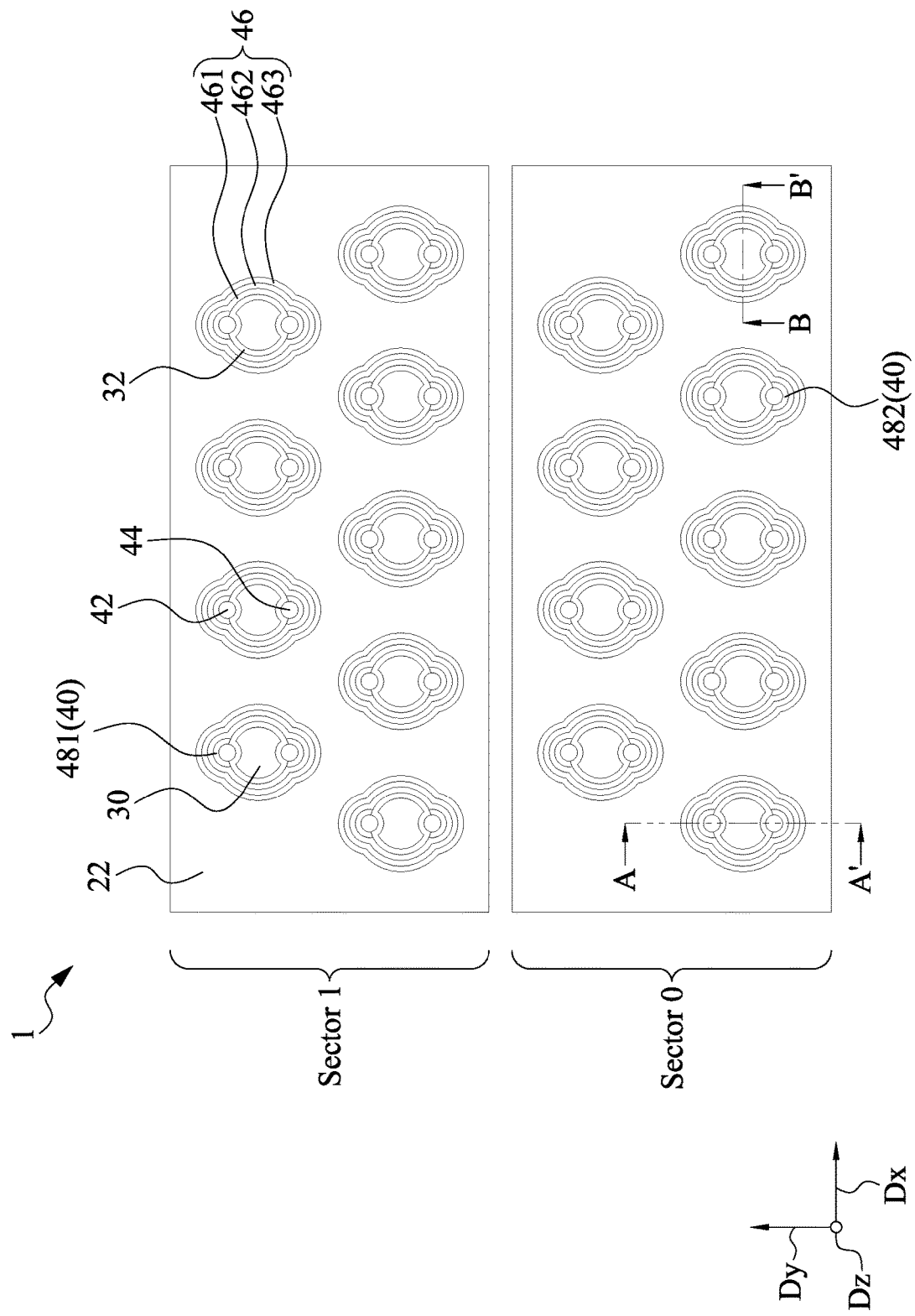
Figure 2C:
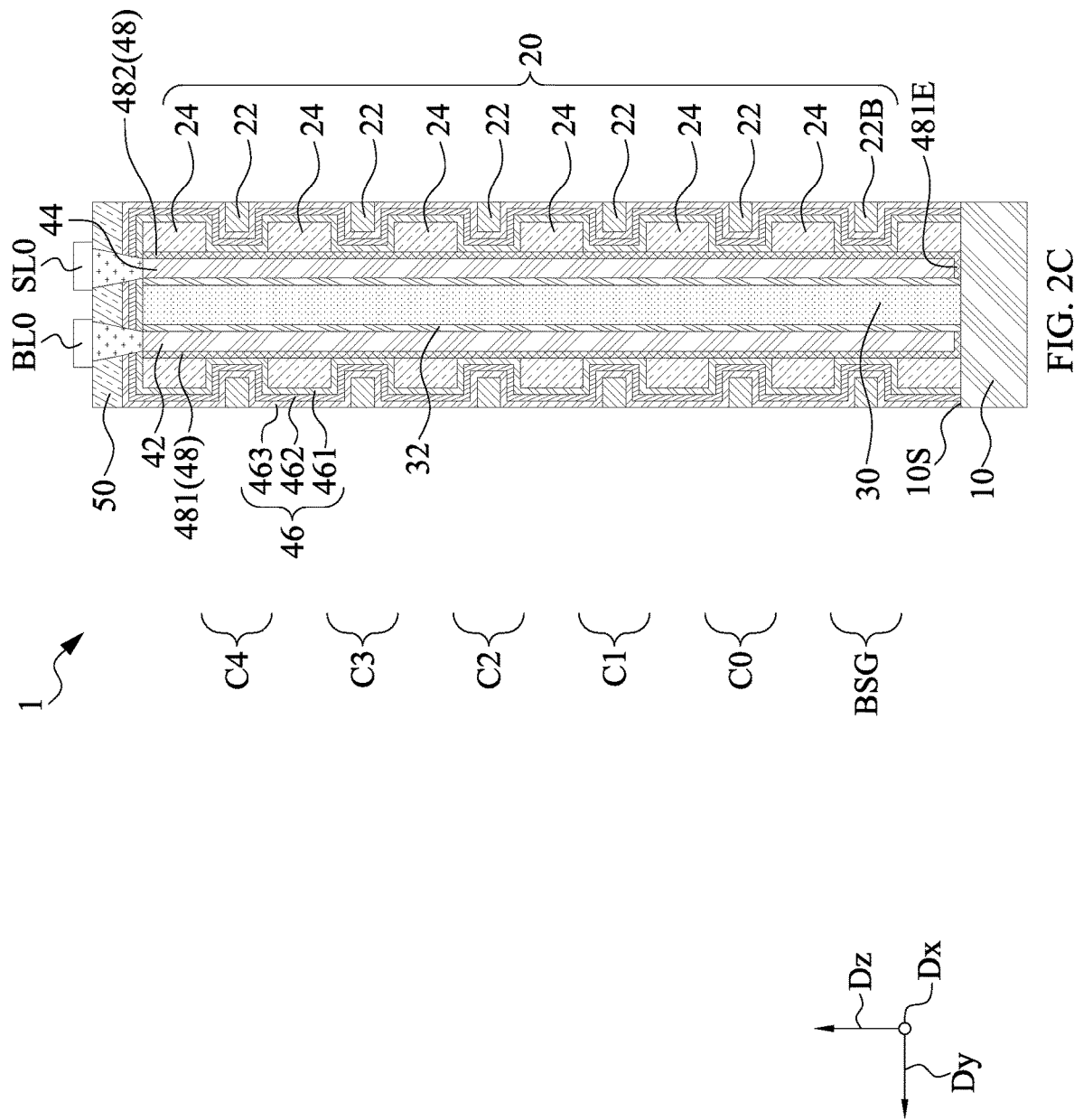

FIG. 2A, FIG. 2B, FIG. 2C and FIG. 2D are schematic diagrams illustrating an integrated circuit in accordance with some embodiments of the present disclosure, where FIG. 2A is a partial perspective view of an integrated circuit in accordance with some embodiments of the present disclosure, FIG. 2B is a top view of an integrated circuit in accordance with some embodiments of the present disclosure, FIG. 2C is a cross-sectional view of an integrated circuit along line A-A' of FIG. 2B, and FIG. 2D is a cross-sectional view of an integrated circuit along line B-B' of FIG. 2B. In some embodiments, the integrated circuit 1 includes memory devices along with other electronic devices such as transistors. As shown in FIG. 2A, FIG. 2B, FIG. 2C and FIG. 2D, the integrated circuit 1 includes a substrate 10, a stack 20 of gate layers 22 and insulating layers 24 and a plurality of isolation columns 30. The substrate 10 may, but is not limited to, a semiconductor substrate. The substrate 10 may include a bulk substrate or a composite substrate. In some embodiments, the material of the substrate 10 may comprise elementary semiconductor such as silicon or germanium. In some embodiments, the material of the substrate 10 may include a compound semiconductor such as compound semiconductor. By way of example, the III-V compound semiconductor may include gallium arsenic (GaAs), gallium phosphide (GaP), indium phosphide (InP), indium arsenide (InAs), other III-V compound semiconductors, or a combination thereof. The substrate 10 includes a surface 10S (e.g., an active surface) on which electronic and/or semiconductor devices such as active devices, passive devices or the like are formed. In some embodiments, driving devices such as metal-oxide semiconductor (MOS) transistors (not shown) may be formed adjacent to the surface 10S of the substrate 10.

The gate layers 22 and the insulating layers 24 of the stack 20 may be alternately arranged over the surface 10S of the substrate 10 along a first direction Dz. The first direction Dz may be substantially perpendicular to the surface 10S of the substrate 10. In some embodiments, the material of the gate layers 22 may include a conductive material such as metal or metal alloy. By way of example, the material of the gate layers 22 may include tungsten (W), aluminum (Al), copper (Cu) or an alloy thereof. The gate layers 22 using metal material is advantageous due to low RC. In some other embodiments, the material of the gate layers 22 may include doped semiconductor material. By way of example, the material of the gate layers 22 may include doped silicon such as polycrystalline silicon. The material of the insulating layers 24 may include insulating material such as inorganic insulating material. By way of example, the material of the insulating layers 24 may include silicon oxide or the like. In some embodiments, the gate layers 22 may, but is not limited to, include substantially the same thickness. By way of example, each of the gate layers 22 may have a thickness ranging from about 200 angstroms to about 600 angstroms. In some embodiments, the insulating layers 24 may, but is not limited to, include substantially the same thickness. By way of example, each of the insulating layers 24 may have a thickness ranging from about 50 angstroms to about 400 angstroms. The layers of the stack 20 can be modified. By way of example, the stack 20 may include six insulating layers 24 with five gate layers 22 interposed therebetween.

The plurality of isolation columns 30 extend through the gate layers 22 and the insulating layers 24 of the stack 20. In some embodiments, the isolation columns 30 may be arranged over the substrate 10 in an array. In some embodiments, the material of the isolation columns 30 may include an insulating material such as inorganic insulating material. By way of example, the material of the isolation columns 30 may, but is not limited to, include silicon oxide, silicon nitride, silicon oxynitride or the like. In some embodiments, each of the isolation columns 30 may, but is not limited to, include a cylinder shape. The dimension such as a diameter or a width of the isolation column 30 may, but is not limited to, be ranging from about 100 nm to about 400 nm.

The integrated circuit 1 may further include a plurality of channel layers 32, a plurality pairs of first conductive features 42 and second conductive features 44 and a storage layer 46. Each of the channel layers 32 may laterally cover a respective isolation column 30. In some embodiments, each of the channel layers 32 is surrounded by the plurality of gate layers 22 and the insulating layers 24. In some embodiments, each of the channel layers 32 may include a cylinder shell shape covering the contour of the respective isolation column 30. The material of the channel layers 32 includes a semiconductor material. By way of example, the material of the channel layers 32 may include elementary semiconductor material such as silicon (e.g., polycrystalline silicon), oxide semiconductor material such as indium gallium zinc oxide (IGZO) or other suitable semiconductor material. In some embodiments, the thickness of the channel layer 32 may be ranging from about 30 angstroms to about 200 angstroms, but is not limited thereto. The integrated circuit 1 has gate all around (GAA) design in which each of the gate layers 22 is all around the channel layer 32, which can provide excellent and stable gate control and tight distribution. Moreover, the channel layer 32 is a ring shaped channel layer in a horizontal plane with a large channel width, which results in a high read current for the memory device.

The plurality pairs of first conductive features 42 and second conductive features 44 extend along the first direction Dz. In some embodiments, each pair of first conductive feature 42 and second conductive feature 44 is disposed adjacent to a respective isolation column 30. The first conductive feature 42 and the second conductive feature 44 may be disposed on two sides of a respective isolation column 30. For example, the first conductive feature 42 and the second conductive feature 44 may be disposed on two opposing sides of a respective isolation column 30. In some embodiments, each of the first conductive features 42 and the second conductive feature 44 may, but is not limited to, include a cylinder shape. In some embodiments, the pair of the first conductive feature 42 and the second conductive feature 44 may be configured as a pair of source electrode and drain electrode. Thus, the first conductive feature 42 may also be referred to as a first source/drain electrode, and the second conductive feature 44 may also be referred to as a second source/drain electrode.

In some embodiments, the material of the first conductive feature 42 and the second conductive feature 44 may include a conductive material such as metal or metal alloy. By way of example, the material of the first conductive feature 42 and the second conductive feature 44 may include tungsten (W), aluminum (Al), copper (Cu) or an alloy thereof. In some embodiments, the material of the first conductive feature 42 and the second conductive feature 44 may include doped semiconductor material. By way of example, the material of the first conductive feature 42 and the second conductive feature 44 may include doped silicon such as polycrystalline silicon. The dimension of the first conductive feature 42 may be substantially the same as that of the second conductive feature 44. The dimension of the first conductive feature 42/the second conductive feature 44 may be smaller than that of the isolation column 30. The contour of the first conductive feature 42 and the second conductive feature 44 may be surrounded by the gate layers 22.

The storage layer 46 is disposed between the plurality of gate layers 22 and the respective channel layer 32. In some embodiments, the storage layer 46 covers an edge of the gate layer 22 facing the isolation column 30. The storage layer 46 may further cover two edges of the gate layer 22 facing the overlying insulating layer 24 and the underlying insulating layer 24. In other words, the storage layer 46 may cover three edges of the gate layer 22 and may be disposed between the gate layer 22 and the channel layer 32 and between adjacent gate layers 22. In some embodiments, the storage layer 46 may be a multi-layered storage layer. By way of example, the storage layer 46 may include an ONO structure including a first silicon oxide layer 461, a silicon nitride layer 462 and a second silicon oxide layer 463. In some embodiments, the thickness of the first oxide layer 461 may, but is not limited to, be ranging from about 15 angstroms to about 45 angstroms. In some embodiments, the thickness of the silicon nitride layer 462 may, but is not limited to, be ranging from about 60 angstroms to about 90 angstroms. In some embodiments, the thickness of the third oxide layer 463 may, but is not limited to, be ranging from about 30 angstroms to about 60 angstroms. In some other embodiments, the storage layer 46 may be a single-layered storage layer. By way of example, the storage layer 46 may include a ferroelectric material layer such as a hafnium oxide layer. In some embodiments, the thickness of the ferroelectric material layer may, but is not limited to, be ranging from about 2 nm to about 20 nm. In some other embodiments, the storage layer 46 may include a ferroelectric material layer such as a hafnium oxide layer and one or more dielectric material layer such as silicon oxide layer, silicon nitride layer or a stack layer thereof.

In some embodiments, the integrated circuit 1 may further include a pair of isolation structures 48 extending along the first direction Dz. The pair of isolation structures 48 may include a first isolation structure 481 disposed between the first conductive feature 42 and the gate layers 22, and a second isolation structure 482 disposed between the second conductive feature 44 and the gate layers 22. The pair of isolation structures 48 can be configured to isolate the gate layers 22 from the first conductive feature 42 and the second conductive feature 44. Specifically, the first conductive feature 42 can be isolated from the gate layers 22 by the first isolation structure 481, and the second conductive feature 44 can be isolated from the gate layers 22 by the second isolation structure 482. In some embodiments, the pair of isolation structures 48 may be further configured to isolate the first conductive feature 42 and the second conductive feature 44 from the substrate 10. The material of the isolation structures 48 may include insulating material such as silicon oxide or other suitable material.

As illustrate in FIG. 2C, the first isolation structure 481 may further include an extension portion 481E between a bottom of the first conductive feature 42 and the substrate 10 to isolate the first conductive feature 42 from the substrate 10. The second isolation structure 482 may further include an extension portion 482E between a bottom of the second conductive feature 44 and the substrate 10 to isolate the second conductive feature 44 from the substrate 10.

In some embodiments, the gate layers 22, the channel layer 32, the first conductive feature 42, the second conductive feature 44 and the storage layer 46 around a respective isolation column 30 collectively form a plurality of memory cells stacked along the first direction Dz. By way of example, five gate layers 22 may be stacked along the first direction Dz around the channel layer 32 to form five memory cells C0-C4 around the same isolation column 30. The stack of the memory cells C0-C4 along the first direction Dz can increase memory density to meet advanced applications such as supply chain management (SCM) and AI applications.

In some embodiments, a bottommost gate layer 22B of the gate layers 22, the channel layer 32, the first conductive feature 42, the second conductive feature 44 and the storage layer 46 may collectively form a ground transistor BSG adjacent to a bottom portion of each of the isolation columns 30 and between the memory cell C0 and the substrate 10. The ground transistor BSG may be configured to isolate leak current from the channel layer 32 to the substrate 10.

Figure 3A:
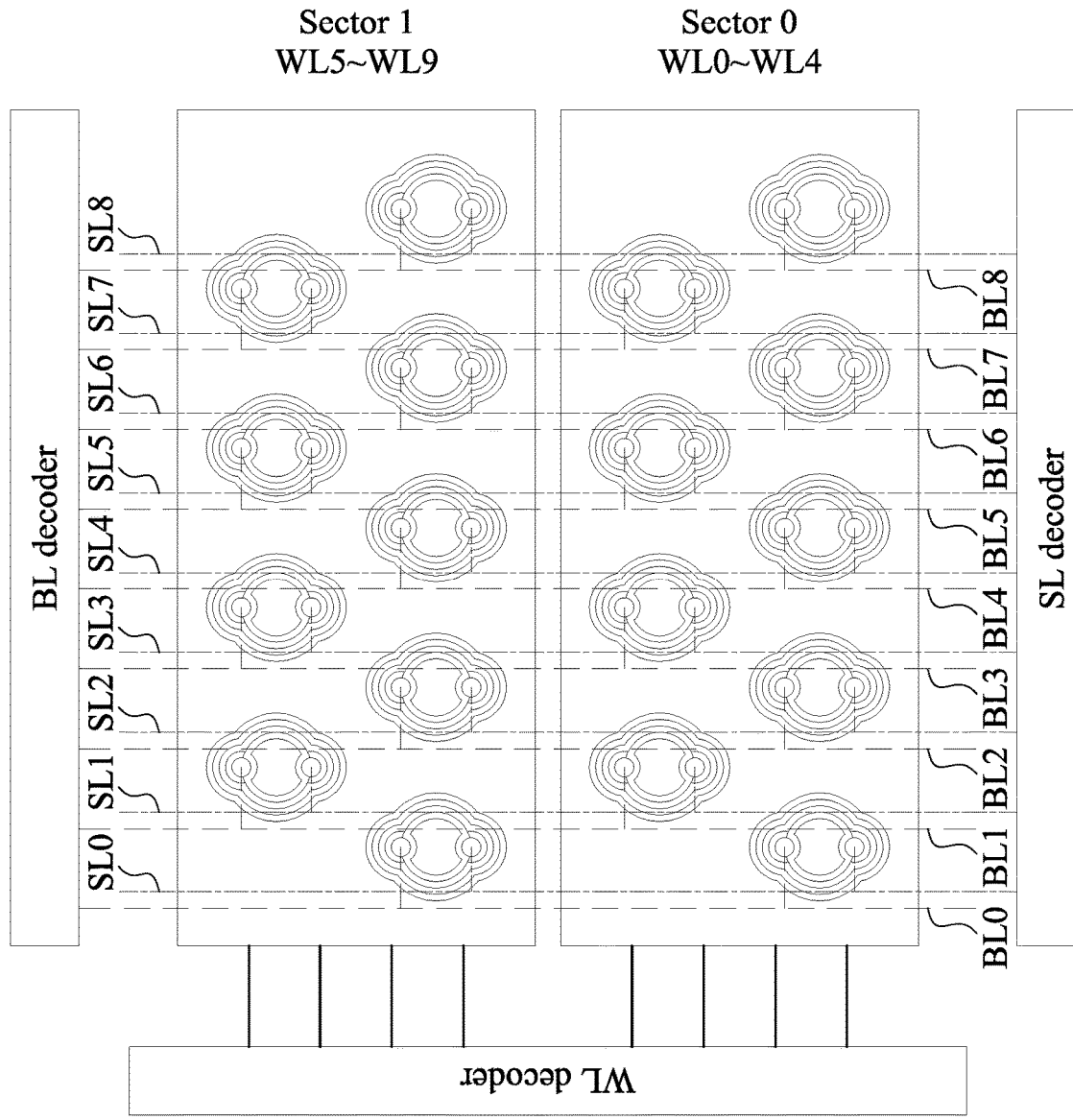
FIG. 3A is a schematic view illustrating an architecture of an integrated circuit in accordance with some embodiments of the present disclosure.
Figure 3A:
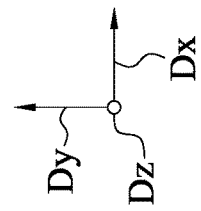
Figure 3B:
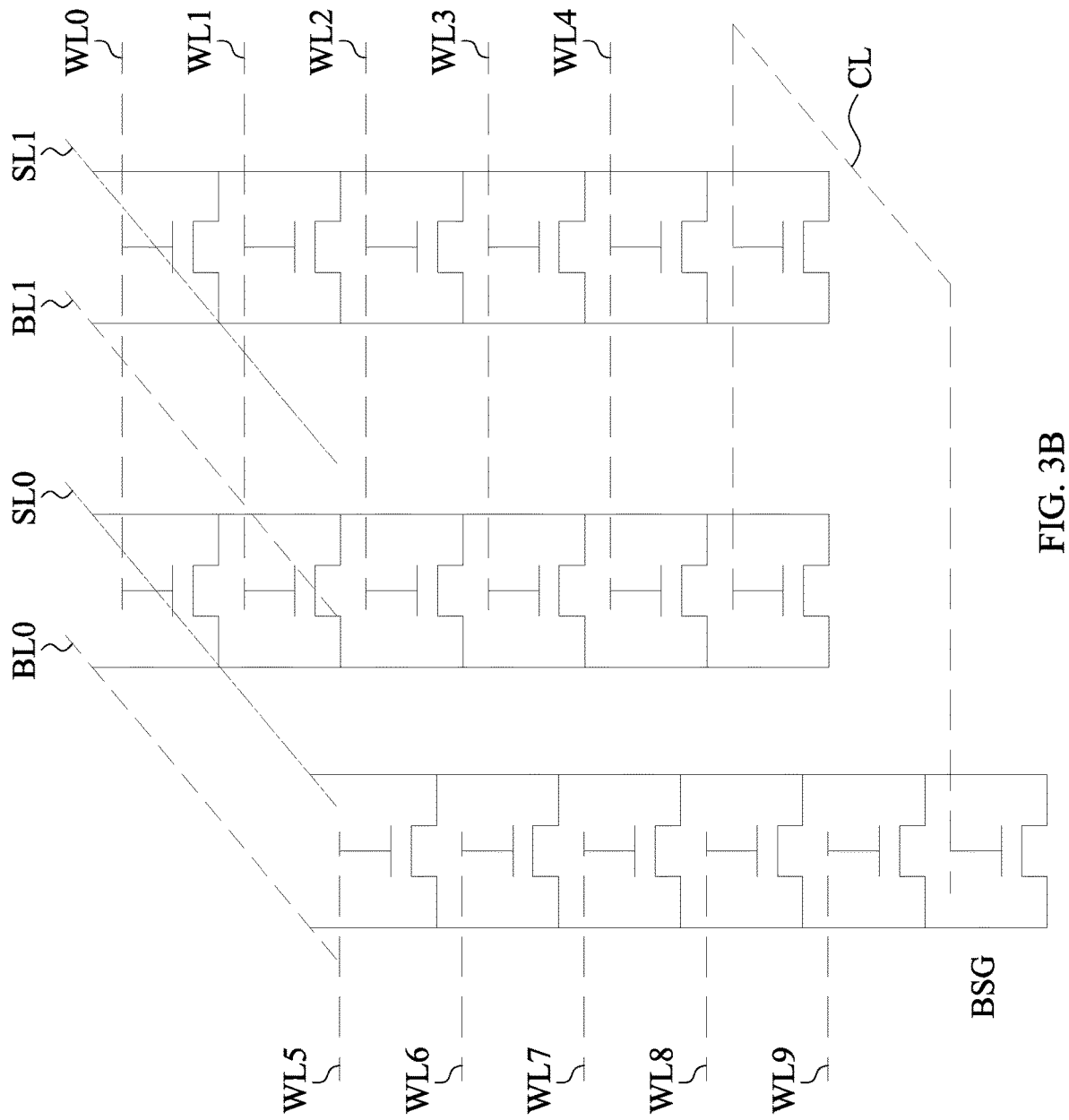
FIG. 3B is an equivalent circuit diagram of an integrated circuit in accordance with some embodiments of the present disclosure.

FIG. 3A is a schematic view illustrating an architecture of an integrated circuit in accordance with some embodiments of the present disclosure, and FIG. 3B is an equivalent circuit diagram of an integrated circuit in accordance with some embodiments of the present disclosure. Referring to FIGS. 2A-2D and FIG. 3A-3B, the integrated circuit 1 may include a plurality of sectors such as Sector 0 and Sector 1. Each of the Sector 0 and Sector 1 may include the stack 20 of gate layers 22 and insulating layers 24, the isolation columns 30, the channel layers 32, the plurality pairs of first conductive features 42 and second conductive features 44, the storage layers 46, the isolation structures 48 and the ground transistors BSG. Details of the stack 20 of gate layers 22 and insulating layers 24, the isolation columns 30, the channel layers 32, the plurality pairs of first conductive features 42 and second conductive features 44, the storage layers 46, the isolation structures 48 and the ground transistors BSG are described in the above paragraphs, and thus are not redundantly described.

The integrated circuit 1 may further include a plurality of word lines (e.g., WL0-WL9), a plurality of bit lines (e.g., BL0-BL8), and a plurality of source lines (e.g., SL0-SL8). The word lines WL0-WL9 may be disposed over the substrate 10 and electrically connected to the plurality of gate layers 22, respectively. In some embodiments, the word lines WL0-WL9 may be arranged along a second direction Dx substantially parallel to the surface 10S of the substrate 10. The word lines WL0-WL7 are also electrically connected to one or more word line decoder to receive control signals. In some embodiments, the word lines WL0-WL04 are electrically connected to different gate layers 22 of the Sector 0, and configured to respectively transmit the control signals to the different gate layers 22 of the Sector 0. The word lines WL5-WL09 are electrically connected to different gate layers 22 of the Sector 1, and configured to respectively transmit the control signals to the different gate layers 22 of the Sector 1.

The bit lines BL0-BL8 are disposed over the substrate 10 and electrically connected to the first conductive features 42. In some embodiments, the bit lines BL0-BL8 may be arranged along a third direction Dy substantially parallel to the surface 10S of the substrate 10 and substantially perpendicular to the second direction Dx. The bit lines BL0-BL8 are also electrically connected to one or more bit line decoder to transmit control signals. In some embodiments, each of the bit lines BL0-BL8 is electrically connected to a respective first conductive feature 42 in each of the Sector 0 and the Sector 1, and configured to respectively transmit the bit signals to the respective first conductive feature 42 in the Sector 0 and the respective first conductive feature 42 in the Sector 1.

The source lines SL0-SL8 are disposed over the substrate 10 and electrically connected to the second conductive features 44. In some embodiments, the source lines SL0-SL8 may be arranged along the third direction Dy. The source lines SL0-SL8 are also electrically connected to one or more source line decoder to transmit control signals. In some embodiments, each of the source lines SL0-SL8 is electrically connected to a respective second conductive features 44 in each of the Sector 0 and the Sector 1, and configured to respectively transmit the bit signals to the respective second conductive features 44 in the Sector 0 and the respective second conductive features 44 in the Sector 1.

In some embodiments of the present disclosure, the memory cells around the same isolation column 30 in Sector 0 are driven by different word lines WL0-WL4, the same bit line e.g., the bit line BL1 and the same source line e.g., the source line SL1. The memory cells around an isolation column 30 in the Sector 0 and the memory cells around another isolation column 30 in Sector 1 are driven by different word lines e.g., word line WL2 and word line WL7, the same bit line e.g., the bit line BL3 and the same source line e.g., the source line SL3. Accordingly, interference between adjacent memory cells can be mitigated. Based on the above architecture, the integrated circuit 1 may have small erase unit and high erase speed.

In some embodiments, a bottommost gate layer 22B of the gate layers 22, the channel layer 32, the first conductive feature 42, the second conductive feature 44 and the storage layer 46 may collectively form a ground transistor BSG adjacent to a bottom portion of each of the isolation columns 30 and between the memory cell C0 and the substrate 10. The ground transistor BSG may be configured to isolate leak current from the channel layer 32 to the substrate 10. In some embodiments, the ground transistors BSG can be connected and driven by a common signal line CL. The ground transistors BSG can be switched on or switched off simultaneously to isolate leak current from the channel layers 42 to the substrate 10.

Table 1 shows bias condition during programing selected sector and unselected sector of the memory device of FIG. 3A, Table 2 shows bias condition during erasing selected sector and unselected sector of the memory device of FIG. 3A and Table 3 shows bias condition during read selected sector and unselected sector of the memory device of FIG. 3A.

TABLE 1

| | | | | Programming | | | |
|---|---|---|---|---|---|---|---|
| | | WL | Selected BL | Selected BL | Unselected BL | Unselected SL | BSG |
| Selected Sector | Selected WL | Vpgm | 0 | 0 | Vinhibit | Vinhibit | 0 |
| | Unselected WL | 0 | 0 | 0 | Vinhibit | Vinhibit | 0 |
| Unselected Sector | Unselected WL | 0 | 0 | 0 | Vinhibit | Vinhibit | 0 |

TABLE 2

| | | | | Erasing | | | |
|---|---|---|---|---|---|---|---|
| | | WL | Selected BL | Selected BL | Unselected BL | Unselected SL | BSG |
| Selected Sector | Selected WL | 0 | Vers | Vers | Vers | Vers | floating |
| | Unselected WL | 0 | Vers | Vers | Vers | Vers | floating |
| Unselected Sector | Unselected WL | floating | Vers | Vers | Vers | Vers | floating |

TABLE 3

| | | Reading | | | | | |
|---|---|---|---|---|---|---|---|
| | | WL | Selected BL | Selected BL | Unselected BL | Unselected SL | BSG |
| Selected Sector | Selected WL | Vread | Vbl | 0 | 0 | 0 | 0 |
| | Unselected WL | 0 | Vbl | 0 | 0 | 0 | 0 |
| Unselected Sector | Unselected WL | floating | Vbl | 0 | 0 | 0 | 0 |

Figure 4A:
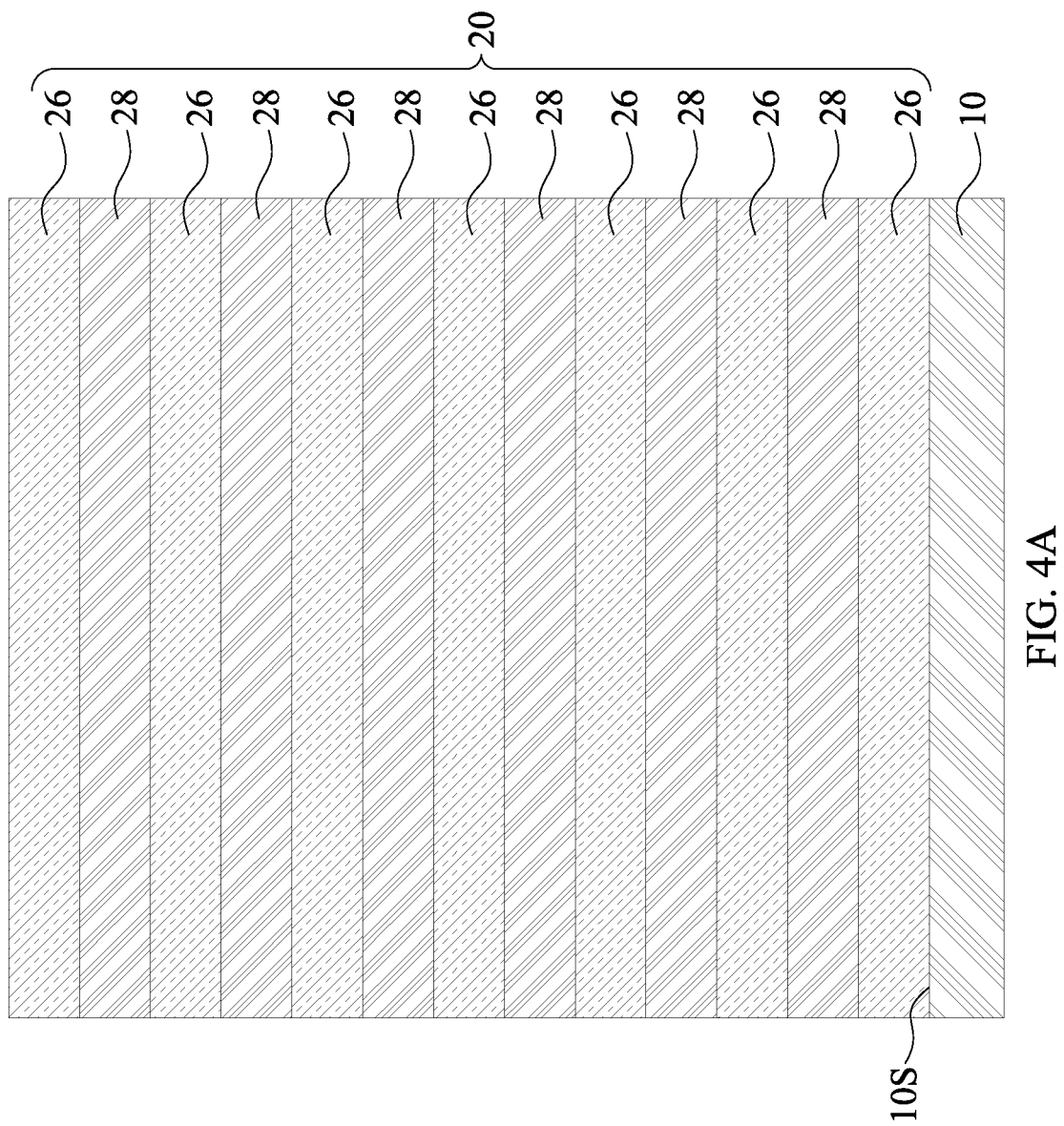

FIG. 4A, FIG. 4B, FIG. 4C1, FIG. 4C2, FIG. 4D1, FIG. 4D2, FIG. 4E1, FIG. 4E2, FIG. 4F1, FIG. 4F2, FIG. 4F3, FIG. 4G1, FIG. 4G2, FIG. 4H1, FIG. 4H2, FIG. 4H3, FIG. 4I1, FIG. 4I2, FIG. 4J1 and FIG. 4J2 are schematic views at one of various operations of manufacturing an integrated circuit according to one or more embodiments of the present disclosure. FIG. 4A, FIG. 4B, FIG. 4G1, FIG. 4G2, FIG. 4I1, FIG. 4I2, FIG. 4J1 and FIG. 4J2 are cross-section views at one of various operations of manufacturing an integrated circuit according to one or more embodiments of the present disclosure. FIG. 4C1 is a top view of at one of various operations of manufacturing an integrated circuit according to one or more embodiments of the present disclosure, and FIG. 4C2 is a cross-section view along a line C-C' in FIG. 4C1. FIG. 4D1 is a top view of at one of various operations of manufacturing an integrated circuit according to one or more embodiments of the present disclosure, and FIG. 4D is a cross-section view along a line D-D' in FIG. 4D1. FIG. 4E1 is a top view of at one of various operations of manufacturing an integrated circuit according to one or more embodiments of the present disclosure, and FIG. 4E2 is a cross-section view along a line E-E' in FIG. 4E1. FIG. 4F1 is a top view of at one of various operations of manufacturing an integrated circuit according to one or more embodiments of the present disclosure, FIG. 4F2 is a cross-section view along a lines F1-F1' in FIG. 4F1, and FIG. 4F3 is a cross-section view along a line F2-F2' in FIG. 4F1. FIG. 4H1 is a top view of at one of various operations of manufacturing an integrated circuit according to one or more embodiments of the present disclosure, FIG. 4H2 is a cross-section view along a line H1-H1' in FIG. HF1, and FIG. 4H3 is a cross-section view along a line H2-H2' in FIG. 4H1.

Referring to FIG. 4A, a substrate 10 is received. The substrate 10 may, but is not limited to, a semiconductor substrate. The substrate 10 includes a surface 10S (e.g., an active surface) on which electronic and/or semiconductor devices such as active devices, passive devices or the like are formed. In some embodiments, driving devices such as metal-oxide semiconductor (MOS) transistors (not shown) may be formed adjacent to the surface 10S of the substrate 10. Subsequently, a stack 20 of a plurality pair of first layers 26 and second layers 28 are form over the substrate 10. In some embodiments, the first layers 26 and the second layers 28 are alternately arranged over the substrate 10. The material of the first layer 26 and the material of the second layers 28 are different in etching rate with respect to the same etchant such that the second layers 28 can be selectively removed in successive operations. In some embodiments, the material of the first layer 26 may include silicon oxide, while the material of the second layer 26 may include silicon nitride. The second layers 28 may be configured as the insulating layers 24 as illustrated in FIGS. 2A-2D.

Figure 4B:
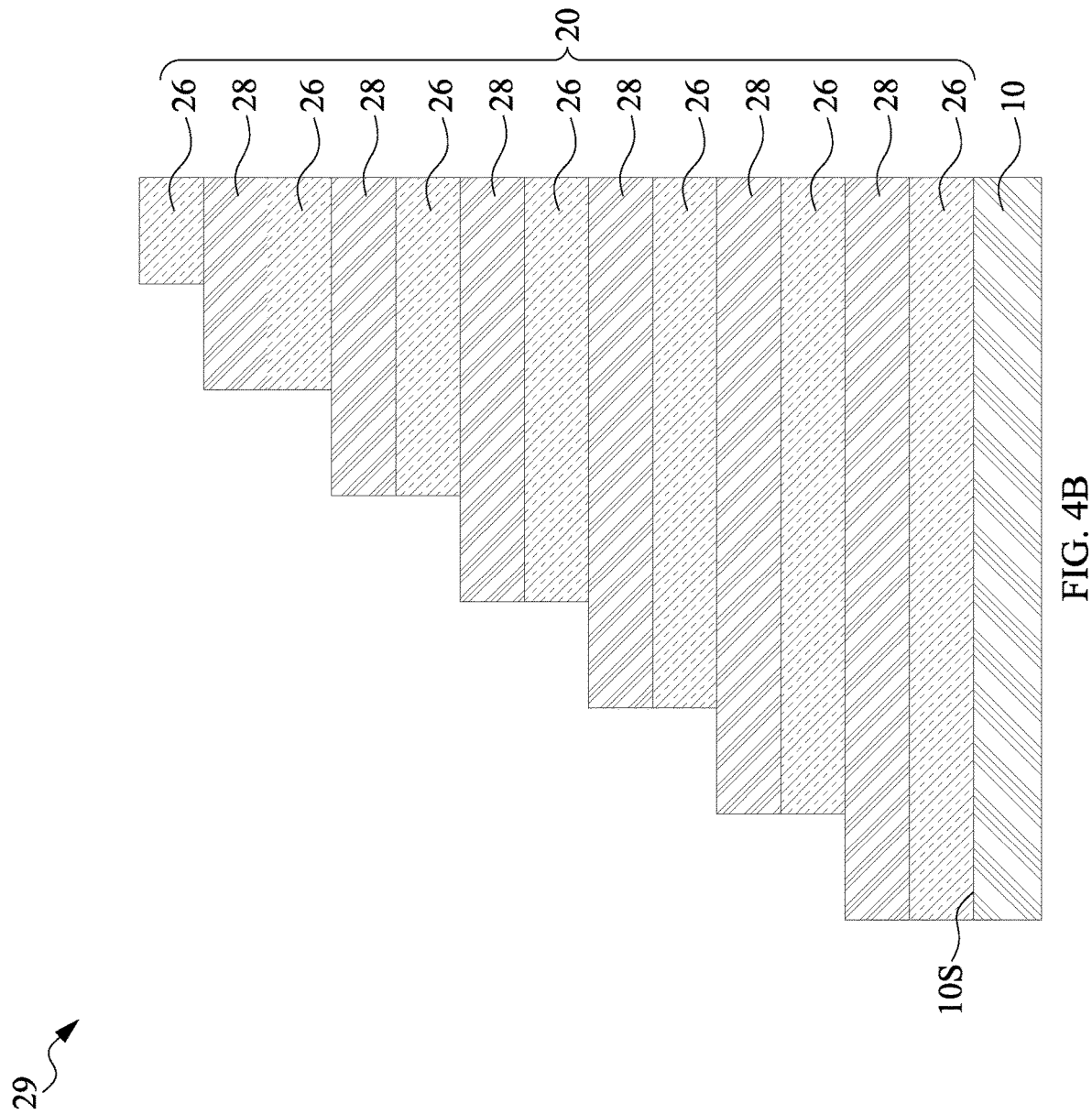

Referring to FIG. 4B, the stack 20 of first layers 26 and second layers 28 are patterned by partially removing an overlying first layer 26 and an overlying second layer 28 to form a stair structure 29. The first layers 26 and the second layers 28 can be patterned by photolithography and etching techniques. In the stair structure 29, an underlying first layer 26 and an underlying second layer 28 laterally exceed the overlying first layer 26 and the overlying second layer 28. The stair structure 29 may be configured to facilitate formation of electrical contacts for different word lines in successive operation. In some embodiments, the stair structure 29 is formed adjacent to one or more edges of the stack 20, and may not be shown in some of the following drawings.

Referring to FIG. 4C1 and FIG. 4C2, a plurality of first holes 20H1 are formed in the stack 20 of first layers 26 and second layers 28. The first holes 20H1 may be formed by photolithography and etching techniques. Referring to FIG. 4D1 and FIG. 4D2, an isolation layer 47 is formed on the stack 20 of first layers 26 and second layers 28 and in the first holes 20H1. In some embodiments, the isolation layer 47 is substantially conformally with respect to the profile of the stack 20 of first layers 26 and second layers 28 and the first holes 20H1. The isolation layer 47 may cover the bottoms and sidewalls of the first holes 20H1, and reserves a gap in each first hole 20H1. The material of the isolation layer 47 may include insulating material such as silicon oxide or other suitable material.

Referring to FIG. 4E1 and FIG. 4E2, a plurality of first conductive features 42 and second conductive features 44 are formed in the first holes 20H1. The material of the first conductive feature 42 and the second conductive feature 44 may include metal, doped semiconductor material and the like. The first conductive feature 42 and the second conductive feature 44 may be formed by forming a conductive layer using deposition such as PVD, CVD, electroplating or the like. In some embodiments, a polish operation such as a CMP operation may be performed to remove the conductive layer outside the first holes 20H1. The isolation layer 47 outside the first holes 20H1 may be removed during the polish operation, and isolation structures 48 may be formed in the first holes 20H1. In some embodiments, the isolation structures 48 include first isolation structures 481 surrounding the first conductive features 42 respectively, and second isolation structures 482 surrounding the second conductive feature 44 respectively.

Referring to FIG. 4F1, FIG. 4F2 and FIG. 4F3, a plurality of second holes 20H2 are formed in the stack 20. Each of the second holes 20H2 exposes a portion of a sidewall 42W of the respective first conductive features 42 and a portion of a sidewall 44W of the respective second conductive features 44. The materials of the stack 20 and the material of the conductive features 42, 44 are selected to have high etching selectivity with respect to the same etchant such that the conductive features 42, 44 are not damaged in forming the second holes 20H2.

Referring to FIG. 4G1 and FIG. 4G2, channel layers 32 are formed to cover sidewalk 20W of the second holes 20H2, a portion of the sidewalk 42W of the first conductive features 42 and a portion of the sidewalls 44W of the second conductive features 44. In some embodiments, the channel layers 32 may be formed by depositing a semiconductor layer on the stack 20 and covering the sidewalls 20W of the second holes 20H2, a portion of the sidewalls 42W of the first conductive features 42 and a portion of the sidewalls 44W of the second conductive features 44. The semiconductor layer may further cover the bottoms of the second holes 20H2. The semiconductor layer may be formed by chemical vapor deposition (CVD) or other suitable processes. Subsequently, isolation columns 30 are formed in the second holes 20H2. In some embodiments, the isolation column 30 is surrounded by and in contact with the channel layer 32. In some embodiments, the isolation columns 30 may be formed by form an insulating layer on the stack 20 and filling into the second holes 20H2. The insulating layer may be formed by CVD or other suitable processes. In some embodiments, the semiconductor layer and the insulating layer on the stack 20 may be removed by chemical mechanical polishing (CMP) simultaneously. In some alternative embodiments, the semiconductor layer at the bottoms of the second holes 20H and the semiconductor layer on the stack 20 may be removed by, e.g. etching, prior to the insulating layer is formed. The insulating layer of the isolation columns 30 may be polished subsequent to the semiconductor layer is patterned.

Referring to FIG. 4H1, FIG. 4H2 and FIG. 4H3, trenches 20T are formed in the stack 20. The trenches 20T may expose the surface 10S of the substrate 10, and configured to separate the stack 20 into a plurality of sectors such as Sector 0, Sector 1 and Sector 2. The trenches 20T may laterally expose the first layers 26 and the second layers 28. In some embodiments, the trenches 20T may be formed by anisotropic etching such as dry etching. Subsequently, the exposed second layers 28 are removed to form a plurality of recesses 20R in the stack 20. The recesses 20R may be performed by etching such as a wet etching. The second layers 28 will be replaced with gate layers in subsequent operations.

Referring to FIG. 4I1 and FIG. 4I2, storage layers 46 are formed in the recesses 20R to cover sidewalls 20RW of the recesses 20R. In some embodiments, the storage layer 46 may be a multi-layered storage layer such as an ONO structure including a first silicon oxide layer 461, a silicon nitride layer 462 and a second silicon oxide layer 463. The first silicon oxide layer 461, the silicon nitride layer 462 and the second silicon oxide layer 463 can be consecutively formed on the sidewalls 20RW of the recesses 20R by, e.g., atomic layer deposition (ALD) operation or other suitable operations. In some other embodiments, the storage layer 46 may be a single-layered storage layer such as a ferroelectric material layer. The ferroelectric material can be formed on the sidewalls 20RW of the recesses 20R by, e.g., ALD operation or other suitable operations. Subsequently, a conductive material is formed in the recesses 20R to form gate layers 22 to replace the second layers 28. In some embodiments, the conductive material can be formed in the recesses 20R and a portion of the trenches 20T, and the excessive conducive material in the trenches 20T and on the stack 20 may be subsequently removed by an anisotropic etching such as dry etching, such that the gate layers 22 can be disposed only in the recesses 20R.

Referring to FIG. 4J1 and FIG. 4J2, a passivation layer 50 may be formed over the stack 20 and the stair structure 29. In some embodiments, contacts 52 such as conducive vias are formed in the passivation layer 50 to electrically connect the first conductive features 42 to bit lines to be formed, and contacts 54 such as conducive vias are formed in the passivation layer 50 to electrically connect the second conductive features 44 to source lines to be formed. In some embodiments, contacts 56 such as conducive vias are formed in the passivation layer 50 to electrically connect the gate layers 22 to word lines to be formed. Subsequently, word lines such as word lines WL0 and WL1, bit lines such as bit line BL0 and source lines such as source line SL are formed to form the integrated circuit 1 as shown in FIG. 2A.

In some embodiments of the present disclosure, the memory device has vertical stacking storage layers, which can increase memory density. The memory device has gate all around (GAA) design, which can provide excellent and stable gate control and tight distribution. The channel layer is a ring shaped channel layer in a horizontal plane with a large channel width, which results in a high read current for the memory device. The bit lines and source lines are dedicated to control respective source electrodes and drain electrodes of the memory cells, and thus interference between adjacent memory cells can be alleviated. The memory device has small erase unit, and thus is good for system application such as wear leveling or garbage collection.

In some embodiments, a memory device includes a substrate, a plurality of gate layers and a plurality of insulating layers, an isolation column, a channel layer, a first conductive feature, a second conductive feature, a storage layer and a pair of isolation structures. The gate layers and the insulating layers are alternately stacked over the substrate along a first direction. The isolation column extends through the gate layers and the insulating layers along the first direction. The channel layer laterally covers the isolation column. The first conductive feature and the second conductive feature extend along the first direction and adjacent to the isolation column. The storage layer is disposed between the plurality of gate layers and the channel layer. The pair of isolation structures extends along the first direction. The pair of isolation structures includes a first isolation structure disposed between the first conductive feature and the gate layers, and a second isolation structure disposed between the second conductive feature and the gate layers.

In some embodiments, an integrated circuit includes a substrate and a plurality of sectors. The plurality of sectors are disposed over the substrate. Each of the sectors includes a stack of gate layers and insulating layers, a plurality of isolation columns extending through the gate layers and the insulating layers, a plurality of channel layers each laterally covering a respective isolation column of the isolation columns, a plurality pairs of first source/drain electrodes and second source/drain electrodes each disposed on two sides of a respective isolation column of the isolation columns, and a storage layer disposed between the plurality of gate layers and the channel layers.

In some embodiments, a method of manufacturing an integrated circuit is provided. The method includes following operations. A stack of a plurality pair of first layers and second layers alternately arranged is formed over a substrate. A plurality of first holes is formed in the stack. An isolation layer is formed to cover sidewalls of the first holes.

A plurality of conductive features is formed in the first holes. A plurality of second holes are formed in the stack. Each of the second holes exposes a portion of a sidewall of at least one of the conductive features. A channel layer is formed to cover sidewalls of the second holes and the portions of the sidewalls of the conductive features. The second layers of the stack are replaced with a plurality of gate layers.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a substrate;
   a plurality of gate layers and a plurality of insulating layers alternately stacked over the substrate along a first direction;
   an isolation column extending through the gate layers and the insulating layers along the first direction;
   a channel layer laterally covering the isolation column, wherein the channel layer includes a ring shape encircling a contour of the isolation column from a top view;
   a first conductive feature and a second conductive feature extending along the first direction and adjacent to the isolation column;
   a storage layer disposed between the plurality of gate layers and the channel layer; and
   a pair of isolation structures extending along the first direction, wherein the pair of isolation structures comprises a first isolation structure disposed between the first conductive feature and the gate layers, and a second isolation structure disposed between the second conductive feature and the gate layers.

2. The memory device of claim 1, wherein the gate layers, the channel layer, the first conductive feature, the second conductive feature and the storage layer collectively form a plurality of memory cells stacked along the first direction.

3. The memory device of claim 1, further comprising:
   a plurality of word lines over the substrate and electrically connected to the plurality of gate layers, respectively;
   a bit line over the substrate and electrically connected to the first conductive feature; and
   a source line over the substrate and electrically connected to the second conductive feature.

4. The memory device of claim 3, wherein the plurality of word lines extend along a second direction, and the bit line and the source line extend along a third direction.

5. The memory device of claim 1, wherein the first conductive feature is isolated from the gate layers by the first isolation structure, and the second conductive feature is isolated from the gate layers by the second isolation structure.

6. The memory device of claim 1, wherein the first isolation structure further includes an extension portion between a bottom of the first conductive feature and the substrate to isolate the first conductive feature from the substrate, and the second isolation structure further includes an extension portion between a bottom of the second conductive feature and the substrate to isolate the second conductive feature from the substrate.

7. The memory device of claim 1, wherein each of the gate layers is all around the channel layer.

8. The memory device of claim 1, wherein the first conductive feature and the second conductive feature are disposed on two opposing sides of the isolation column.

9. The memory device of claim 1, wherein each of the first conductive feature and the second conductive feature includes a cylindrical shell shape.

10. The memory device of claim 1, wherein a bottommost gate layer of the gate layers, the channel layer, the first conductive feature, the second conductive feature and the storage layer collectively form a ground transistor, configured to isolate leak current from the channel layer to the substrate.

11. An integrated circuit, comprising:
    a substrate;
    a plurality of sectors over the substrate, each of the sectors comprising:
       a stack of gate layers and insulating layers;
       a plurality of isolation columns extending through the gate layers and the insulating layers;
       a plurality of channel layers each laterally covering a respective isolation column of the isolation columns;
       a plurality pairs of first source/drain electrodes and second source/drain electrodes each disposed on two sides of a respective isolation column of the isolation columns; and
       a storage layer disposed between the plurality of gate layers and the channel layers,
    wherein sidewalls of each isolation column are entirely in contact with a respective channel layer from a top view.

12. The integrated circuit of claim 11, further comprising:
    a plurality of word lines each electrically connected to the gate layers of a respective sector of the plurality of sectors; and
    a plurality of bit lines and source lines transversing the plurality of sectors, wherein each of the plurality of bit lines is electrically connected to one of the first source/drain electrodes in a first sector and one of the first source/drain electrodes in a second sector, and each of the plurality of source lines is electrically connected to one of the second source/drain electrodes in the first sector and one of the second source/drain electrodes in the second sector.

13. The integrated circuit of claim 12, wherein the gate layers, the channel layer, the first source/drain electrode, the second source/drain electrode and the storage layer collectively form a plurality of memory cells around each of the isolation columns.

14. The integrated circuit of claim 13, wherein the memory cells around a first isolation column in the first sector are driven by different word lines, a same bit line and a same source line.

15. The integrated circuit of claim 13, wherein the memory cells around a first isolation column in the first sector and the memory cells around a second isolation column in the second sector are driven by different word lines, a same bit line and a same source line.

16. The integrated circuit of claim 11, wherein for each of the isolation columns, a bottommost gate layer of the gate layers, the channel layer, the first source/drain electrode, the second source/drain electrode and the storage layer collectively form a ground transistor, configured to isolate leak current from the channel layer to the substrate.

17. A memory device, comprising:

a substrate;

a plurality of gate layers and a plurality of insulating layers alternately stacked over the substrate along a first direction;

an isolation column extending through the gate layers and the insulating layers along the first direction;

a channel layer laterally covering the isolation column;

a first conductive feature and a second conductive feature extending along the first direction and adjacent to the isolation column;

a storage layer disposed between the plurality of gate layers and the channel layer;

a first isolation structure disposed between the first conductive feature and the gate layers, and a second isolation structure disposed between the second conductive feature and the gate layers;

a plurality of word lines over the substrate and electrically connected to the plurality of gate layers, respectively;

a bit line over the substrate and electrically connected to the first conductive feature; and a source line over the substrate and electrically connected to the second conductive feature, wherein the first conductive feature and the second conductive feature are separated from the isolation column by the channel layer.

18. The memory device of claim 17, wherein the gate layers, the channel layer, the first conductive feature, the second conductive feature and the storage layer collectively form a plurality of memory cells stacked along the first direction.

19. The memory device of claim 17, wherein the first isolation structure further includes an extension portion between a bottom of the first conductive feature and the substrate to isolate the first conductive feature from the substrate, and the second isolation structure further includes an extension portion between a bottom of the second conductive feature and the substrate to isolate the second conductive feature from the substrate.

20. The memory device of claim 17, wherein each of the gate layers is all around the channel layer.

* * * * *